US011569483B2

United States Patent
Sekine et al.

(10) Patent No.: US 11,569,483 B2
(45) Date of Patent: Jan. 31, 2023

(54) DISPLAY ELEMENT AND ELECTRONIC DEVICE

(71) Applicant: Sony Semiconductor Solutions Corporation, Kanagawa (JP)

(72) Inventors: Masaaki Sekine, Saitama (JP); Takashi Sakairi, Kanagawa (JP); Tomokazu Ohchi, Kanagawa (JP); Tomoyoshi Ichikawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 288 days.

(21) Appl. No.: 16/955,917

(22) PCT Filed: Dec. 21, 2018

(86) PCT No.: PCT/JP2018/047187
§ 371 (c)(1),
(2) Date: Jun. 19, 2020

(87) PCT Pub. No.: WO2019/131487
PCT Pub. Date: Jul. 4, 2019

(65) Prior Publication Data
US 2021/0074954 A1 Mar. 11, 2021

(30) Foreign Application Priority Data
Dec. 26, 2017 (JP) .............................. JP2017-248697

(51) Int. Cl.
*H01L 51/52* (2006.01)
*H01L 27/32* (2006.01)
(Continued)

(52) U.S. Cl.
CPC ........ *H01L 51/5271* (2013.01); *H01L 27/322* (2013.01); *H01L 27/3246* (2013.01);
(Continued)

(58) Field of Classification Search
CPC .............. H01L 51/5271; H01L 27/322; G09G 2300/0452
See application file for complete search history.

(56) References Cited

U.S. PATENT DOCUMENTS

2005/0225232 A1    10/2005  Boroson
2013/0214302 A1     8/2013  Yeh et al.
(Continued)

FOREIGN PATENT DOCUMENTS

JP    2007503093 A    2/2007
JP    2010009793 A    1/2010
(Continued)

OTHER PUBLICATIONS

Japanese Office Action dated Dec. 21, 2021 for corresponding Japanese Application No. 2017-248697.

*Primary Examiner* — Fernando L Toledo
*Assistant Examiner* — Valerie N Newton
(74) *Attorney, Agent, or Firm* — Michael Best & Friedrich LLP

(57) ABSTRACT

There is provided a display element, including: a display region including pixels arranged in a two-dimensional form, each of the pixels including a plurality of sub pixels. In each pixel, a height of a light reflecting portion with respect to a light emitting portion is adjusted for each sub pixel.

10 Claims, 29 Drawing Sheets

(51) Int. Cl.
G09G 3/3225 (2016.01)
G09G 3/3266 (2016.01)
G09G 3/3275 (2016.01)

(52) U.S. Cl.
CPC ......... *G09G 3/3225* (2013.01); *G09G 3/3266* (2013.01); *G09G 3/3275* (2013.01); *G09G 2300/0452* (2013.01); *G09G 2320/0233* (2013.01); *G09G 2320/043* (2013.01)

(56) References Cited

U.S. PATENT DOCUMENTS

| | | |
|---|---|---|
| 2014/0110701 A1 | 4/2014 | Noh |
| 2014/0332762 A1 | 11/2014 | Kim et al. |
| 2017/0250233 A1* | 8/2017 | Ushikubo .......... H01L 51/5265 |
| 2017/0365646 A1 | 12/2017 | Bai et al. |

FOREIGN PATENT DOCUMENTS

| | | |
|---|---|---|
| JP | 2013080584 A | 5/2013 |
| JP | 2013-191533 A | 9/2013 |
| JP | 2014225323 A | 12/2014 |
| JP | 2016081562 A | 5/2016 |

* cited by examiner

| HEIGHT H SATISFYING TOTAL REFLECTION CONDITION | REFLECTOR ANGLE β (°) | | | | | | | | |
|---|---|---|---|---|---|---|---|---|---|
| DISTANCE L (nm) TO INCLINED SURFACE OF REFLECTOR | | 60 | 65 | 68 | 70 | 71 | 73 | 74 | 75 | 80 |
| | 10 | 5 | 6 | 7 | 8 | 8 | 9 | 9 | 9 | 10 |
| | 100 | 50 | 64 | 73 | 78 | 81 | 86 | 89 | 91 | 104 |
| | 500 | 252 | 321 | 363 | 390 | 404 | 431 | 444 | 457 | 520 |
| | 1000 | 503 | 642 | 726 | 781 | 808 | 862 | 888 | 915 | 1040 |
| | 1500 | 755 | 963 | 1089 | 1171 | 1212 | 1293 | 1333 | 1372 | 1559 |
| | 2000 | 1006 | 1284 | 1451 | 1562 | 1616 | 1724 | 1777 | 1829 | 2079 |
| | 2500 | 1258 | 1606 | 1814 | 1952 | 2020 | 2155 | 2221 | 2286 | 2599 |
| | 3000 | 1509 | 1927 | 2177 | 2342 | 2424 | 2586 | 2665 | 2744 | 3119 |

FIG. 16

DISPLAY ELEMENT AND ELECTRONIC DEVICE

TECHNICAL FIELD

The present technology relates to a display element and an electronic device, and more particularly, to a display element and an electronic device which are capable of improving luminance of pixels.

CROSS REFERENCE TO RELATED APPLICATIONS

This application claims the benefit of Japanese Priority Patent Application JP 2017-248697 filed Dec. 26, 2017, the entire contents of which are incorporated herein by reference.

BACKGROUND ART

In recent years, as a light emitting element which emits light by itself when a voltage is applied, a light emission type display element such as an organic EL display element using an organic light emitting diode (OLED) in which a phenomenon called organic electroluminescence (organic EL) is applied has been developed.

In the organic EL display element, if light extraction efficiency is poor, an actual light emission amount in the organic EL element is not used effectively, leading to a loss in terms of power consumption or the like, and thus there is a demand for a technique of extracting light efficiently.

As a technique for improving light extraction efficiency, for example, a technique disclosed in PTL 1 is known. A technique related to an anode reflector structure which reflects some of light propagated on a member surface using a difference in a refractive index between members is disclosed in PTL 1.

CITATION LIST

Patent Literature

PTL 1: JP 2013-191533A

SUMMARY OF INVENTION

Technical Problem

In the organic EL display element, a method of increasing a light emitting area by increasing a size of a specific pixel in order to improve luminance of each pixel can be used, but in a case in which such a method is employed, since a pixel pitch changes, it is difficult to achieve high definition. For this reason, there is a demand for a technique of improving luminance of pixels more appropriately.

It is desirable to make it possible to improve the luminance of the pixels.

Solution to Problem

The present technology is defined by the claims.

Advantageous Effects of Invention

According to an embodiment of the present technology, the luminance of pixels can be improved.

Further, the effect described here is not necessarily limiting, and any effect described in the present disclosure may be included.

BRIEF DESCRIPTION OF DRAWINGS

FIG. 16 is a table illustrating a change in a height of a reflector satisfying a total reflection condition in a case in which a reflector angle is changed.

DESCRIPTION OF EMBODIMENTS

Hereinafter, embodiments of the present technology will be described with reference to the appended drawings. Further, the description will proceed in the following order.
1. Embodiments of present technology
2. Modified example
3. Example of electronic device 1. Embodiments of Present Technology (Configuration Example of Display Element)
FIG. 1 is a block diagram illustrating an example of a configuration of one embodiment of a display element to which the present technology is applied.

Figure 1:
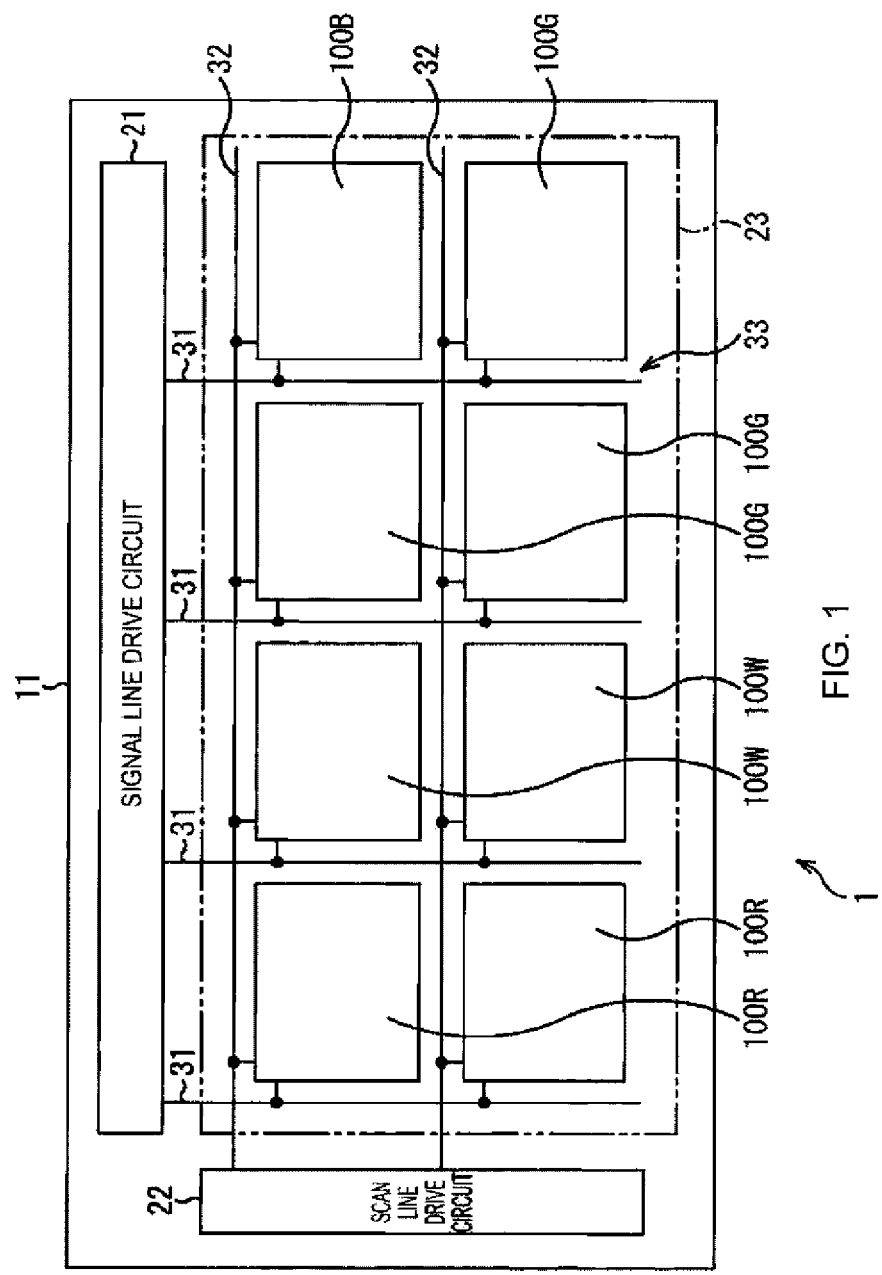
FIG. 1 is a block diagram illustrating an example of a configuration of one embodiment of a display element to which the present technology is applied.

In FIG. 1, a display element 1 is a light emission type display element (display device) such as an organic EL display element using, for example, an organic light emitting diode (OLED).

As illustrated in FIG. 1, in the display element 1, a plurality of pixels (sub pixels 100R, 100W, 100G, and 100B) are two-dimensionally arranged on a substrate 11 made of, for example, glass, a silicon wafer, or a resin, so that a display region 23 is formed. Further, a signal line drive circuit 21 and a scan line drive circuit 22 which are drivers for video display are formed on the periphery of the display region 23.

Figure 2:
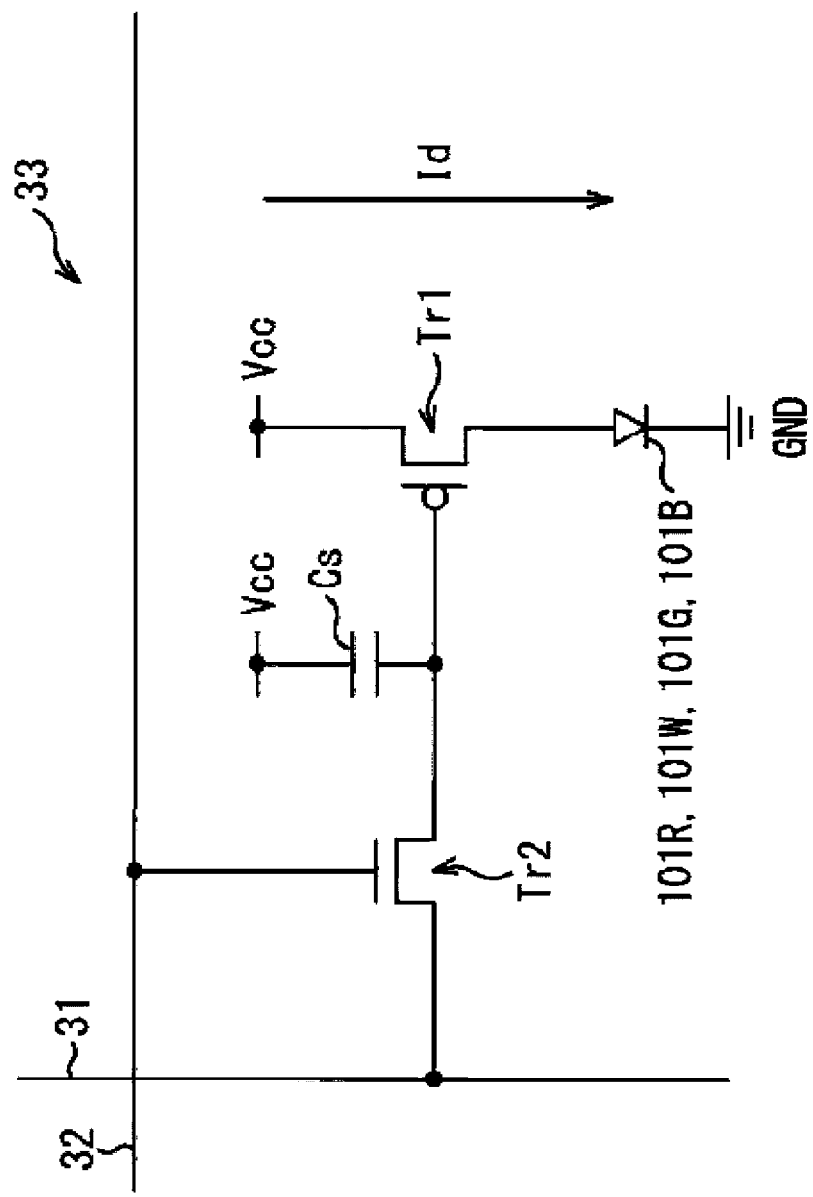
FIG. 2 is a circuit diagram illustrating an example of a configuration of a pixel drive circuit.

A pixel drive circuit 33 is formed in the display region 23. FIG. 2 illustrates an example of a configuration of the pixel drive circuit 33.

As illustrated in FIG. 2, the pixel drive circuit 33 is an active type drive circuit including a drive transistor Tr1, a write transistor Tr2, a capacitor (retention capacitor) Cs therebetween, and organic light emitting elements 101 (101R, 101W, 101G, and 101B) connected to the drive transistor Tr1 in series between a first power line (Vcc) and a second power line (GND).

In the pixel drive circuit 33, a plurality of signal lines 31 are arranged in a column direction, and a plurality of scan lines 32 are arranged in a row direction. Crossing points of the signal lines 31 and the scan lines 32 correspond to the sub pixels 100R, 100W, 100G, and 100B including any one of the organic light emitting elements 101R, 101W, 101G, 101B.

Each signal line 31 is connected to the signal line drive circuit 21, and an image signal is supplied from the signal line drive circuit 21 to a source electrode of the write transistor Tr2 via the signal line 31. Each scan line 32 is connected to the scan line drive circuit 22, and a scan signal is sequentially supplied from the scan line drive circuit 22 to a gate electrode of the write transistor Tr2 via the scan line 32.

Figure 3:
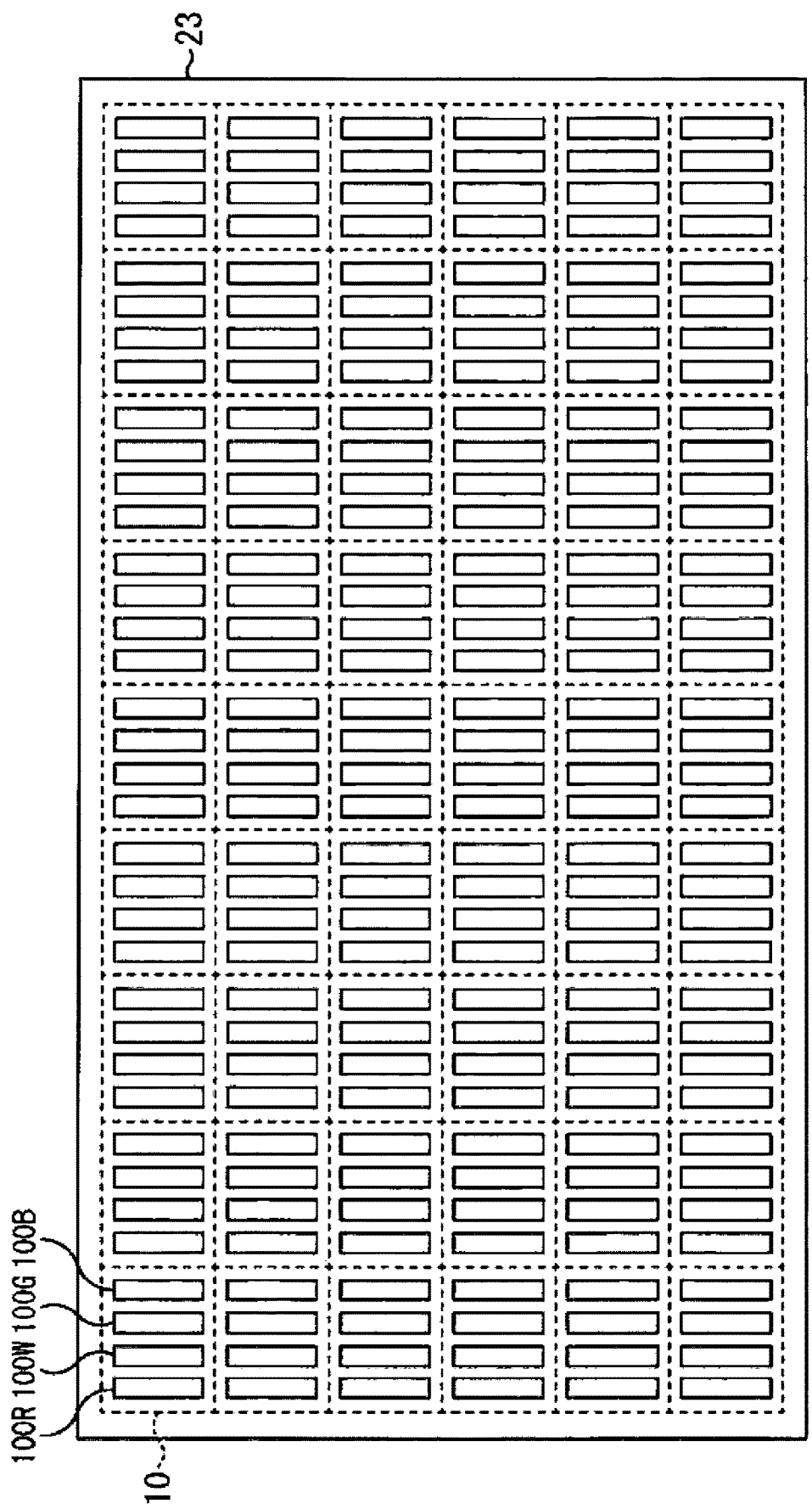
FIG. 3 is a plan view illustrating an example of a configuration of a display region.

FIG. 3 illustrates an example of the plane configuration of the display region 23. In FIG. 3, the display the sub pixel 100R that generates red (R) light, the sub pixel 100W that generates white (W) light, the sub pixel 100G that generates green (G) light, and the sub pixel 100B that generates blue (B) light are sequentially formed in the display region 23 in a two-dimensional form as a whole.

Further, a combination of the adjacent sub pixels 100R, 100W, 100G, and 100B (the sub pixels) constitutes one pixel 10. In other words, a plurality of pixels 10 are arranged in the display region 23 in a two-dimensional form (in a matrix form), and each pixel 10 is constituted by four sub pixels 100 of red (R), white (W), green (G), and blue (B). In other words, in the display region 23, the pixels 10 arranged in the two-dimensional form are referred to as a WRGB pixel.

(Structure of Pixel)
In the organic EL display element, in order to improve the luminance of respective sub pixels constituting a pixel, it is possible to cope with it by changing a size of a sub pixel. However, in a case in which the method of increasing the light emitting area by increasing a size of a specific sub pixel among pixels is employed, since the pixel pitch is changed, it is difficult to achieve high definition.

Figure 4:
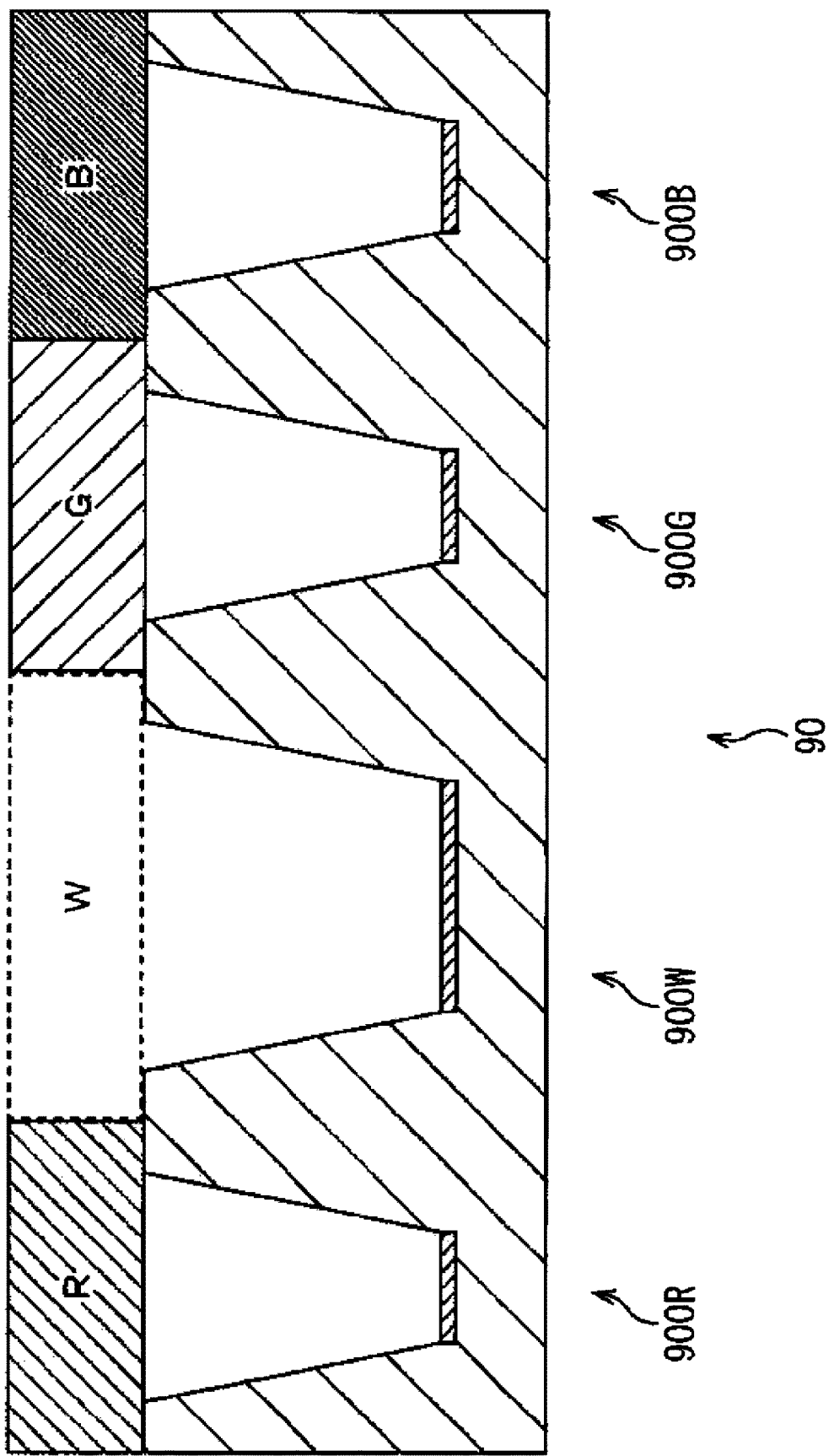
FIG. 4 is a main part cross-sectional view illustrating a part of a structure of a pixel according to a related art.

Specifically, as illustrated in FIG. 4, in a pixel 90 including four sub pixels 900, a structure in which a light emitting area of a light emitting portion in a sub pixel 900W among the four sub pixels 900 is increased in order to improve luminance of the sub pixel 900W is assumed.

In this structure, since the light emitting area is increased only in the sub pixel 900W, the pixel pitch of the sub pixel 900W is different from the pixel pitches of the other sub pixels 900R, 900G, and 900B. Further, as described above, if the pixel pitch is changed for each sub pixel 900, it is difficult to achieve high definition.

In this regard, in the present technology, it is possible to adjust the luminance of each sub pixel 100 without changing the pixel pitch by adjusting a height of a light reflecting portion (reflector) with respect to the light emitting portion for each sub pixel 100 constituting the pixel 10. Hereinafter, structures of the pixels 10 of the first to third embodiments will be described in order as a structure of a pixel to which an embodiment of the present technology is applied.

Figure 5:
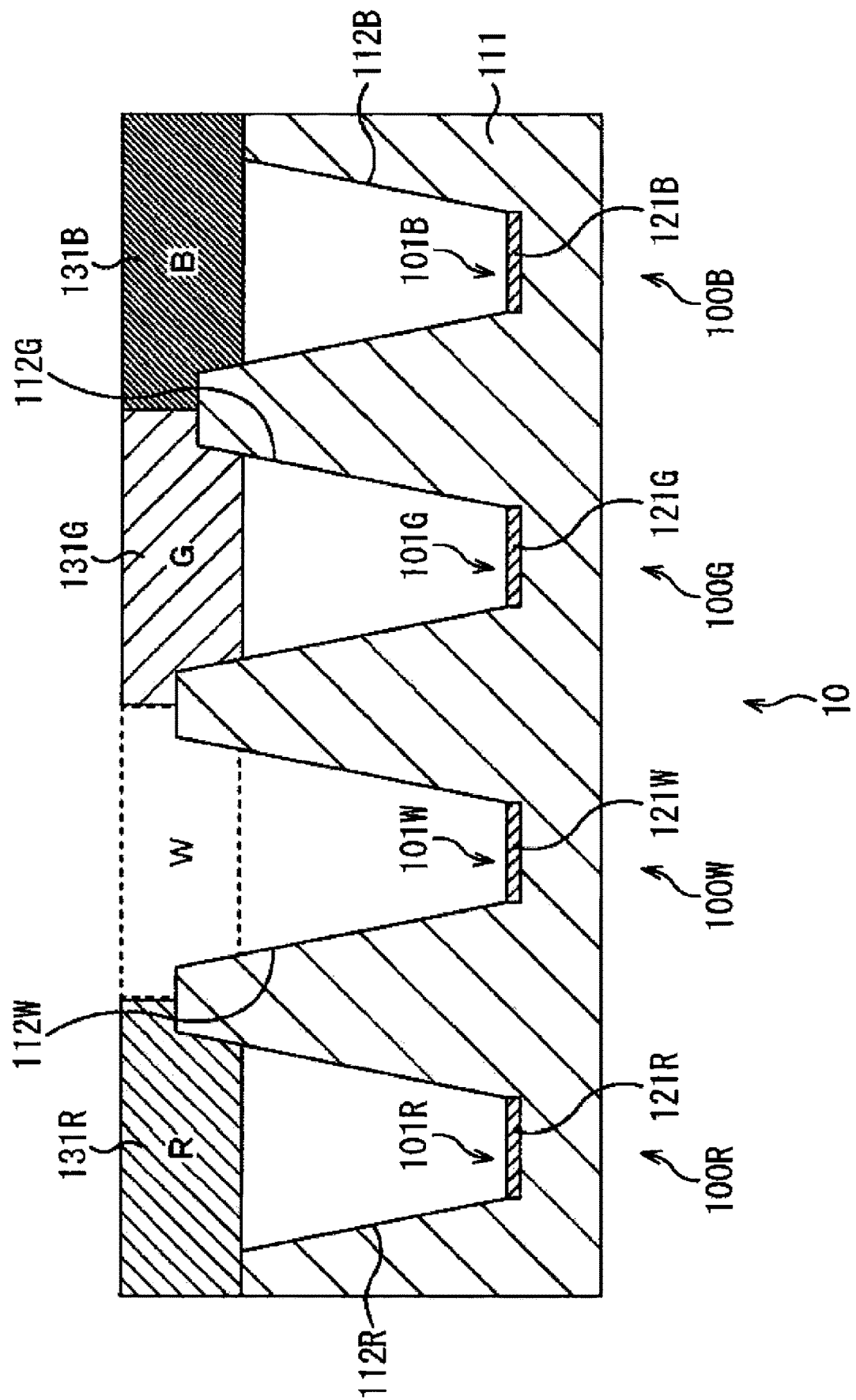
FIG. 5 is a main part cross-sectional view illustrating a part of a structure of a pixel according to a first embodiment.

(First Example of Structure of Pixel)
FIG. 5 is a main part cross-sectional view illustrating a part of a structure of a pixel according to a first embodiment. A structure of a pixel 10 according to the first embodiment will be described below with reference to the main part cross-sectional view.

In FIG. 5, the pixel 10 of the first embodiment includes four sub pixels, that is, a sub pixel 100R that emits red (R) light, a sub pixel 100W that emits white (W) light, a sub pixel 100G that emits green (G) light, and a sub pixel 100B that emits blue (B) light.

Further, the sub pixel 100R includes an organic light emitting element 101R. Similarly, the sub pixels 100W, 100G, and 100B include the organic light emitting elements 101W, 101G, and 101B, respectively.

The organic light emitting element 101R is a light emitting portion including an organic layer including a light emitting layer, and an electrode. In the organic light emitting element 101R, the organic layer has a structure sandwiched between an anode electrode and a cathode electrode, but only an anode electrode 121R is illustrated in FIG. 5. Further, an opening portion in which the anode electrode 121R is exposed specifies the light emitting portion.

Here, the organic layer includes a light emitting layer made of an organic light emitting material, but specifically, for example, the organic layer may have a stacking structure of a hole transport layer, a light emitting layer, and an electron transport layer, a stacking structure of a hole transport layer and a light emitting layer doubling as an electron transport layer, a stacking structure of a hole injection layer, a hole transport layer, a light emitting layer, an electron transport layer, and an electron injection layer, or the like. For example, it is desirable that this organic light emitting element 101R employ a structure that emits white light.

Further, in the sub pixel 100R, a color filter 131R by which transmitted light becomes a red (R) region is formed for the organic light emitting element 101R, and the sub pixel 100R generates red (R) light through such a combination.

Similarly to the organic light emitting element 101R, the organic light emitting element 101W is a light emitting portion including an organic layer and an electrode (including an anode electrode 121W). No color filter is formed for the organic light emitting element 101W, and the sub pixel 100W generates white (W) light.

Similarly to the organic light emitting element 101R, the organic light emitting element 101G is a light emitting portion including an organic layer and an electrode (including an anode electrode 121G). A color filter 131G by which transmitted light becomes a green (G) region is formed for the organic light emitting element 101G, and the sub pixel 100G generates green (G) light through such a combination.

Similarly to the organic light emitting element 101R, the organic light emitting element 101B is a light emitting portion including an organic layer and an electrode (including an anode electrode 121B). A color filter 131B by which transmitted light becomes a blue (B) region is formed for the organic light emitting element 101B, and the sub pixel 100B generates blue (B) light through such a combination.

Further, in the pixel 10 of the first embodiment, a reflector (light reflecting portion) is formed to improve the light extraction efficiency.

Here, the reflector includes a first member that reflects light from the organic light emitting element toward a display surface side on a first substrate and a second member which fills a space between a second substrate arranged opposite to the first substrate and a light reflection structure and has a refractive index different from a refractive index of the first member, and the reflector reflects light propagating through the second member on the surface of the first member, so that the light extraction efficiency can be improved.

As illustrated in FIG. 5, in the pixel 10 of the first embodiment, a reflector 112 is formed on a surface of a first member 111 configured as a light reflecting layer (reflector structure). Further, the first member 111 (in this embodiment and in the subsequently described embodiments) can be formed using a material such as, for example, $SiO_2$ and/or P—SiO.

Further, although not illustrated in FIG. 4, in the pixel 10 of the first embodiment, a second member (for example, a second member 151 in FIG. 22 to be described later) that propagates light from each organic light emitting element 101 and emits the light toward the outside is formed, and the first member 111 is formed to fill a space between the second members. In other words, the light reflecting layer (reflector structure) is formed by the first member 111 and the second member (for example, the second member 151 in FIG. 22 to be described later).

As illustrated in FIG. 5, in the pixel 10 of the first embodiment, the four sub pixels including the sub pixel 100R, the sub pixel 100W, the sub pixel 100G, and the sub pixel 100B differ in the height of the reflector 112 (the height of the inclined surface of the first member 111).

Here, in the first member 111, a side wall of the opening portion in which the anode electrode 121 is exposed is inclined at a predetermined inclination angle (reflector angle), and the inclined surface (surface) forms the reflector 112. Hereinafter, the height of the inclined surface in the stacking direction is also referred to as an "inclined surface height" of the reflector 112.

In other words, in the pixel 10 of the first embodiment, in a case in which the inclined surface heights of the reflectors 112 in the respective sub pixels 100 are compared, for example, a relation illustrated in the following Formula (1) can be obtained.

$$\text{Inclined surface height of reflector} 112W > \text{inclined surface height of reflector} 112G > \text{inclined surface height of reflector} 112R > \text{inclined surface height of reflector} 112B \quad (1)$$

Here, in Formula (1), the inclined surface height of the reflector 112W corresponds to the height of the inclined surface of the first member 111 in the sub pixel 100W. Similarly, the inclined surface heights of the reflectors 112G, 112R, and 112B correspond to the heights of the inclined surfaces of the first members 111 in the sub pixels 100G, 100R, and 100B.

As described above, in the pixel 10 of the first embodiment, luminance of a specific sub pixel 100 is increased such that the four sub pixels 100 are formed to differ in the inclined surface height of the reflector 112, and the respective sub pixels 100 differ in luminance. In particular, when the inclined surface height of the reflector 112W of the sub pixel 100W is high, a region in which light from the organic light emitting element 101W (the anode electrode 121W) undergoes total reflection increases, and thus the luminance of the sub pixel 100W is improved, whereby the luminance of the entire pixel 10 can be improved.

Further, in the pixel 10 of the first embodiment, since the region that reflects light, that is, the inclined surface height of the reflector 112 is changed without changing the light emitting area or the pitch arrangement in each sub pixel 100, the respective sub pixels 100 differ in luminance, and thus it is possible to easily achieve high definition.

As described above, in the pixel 10 of the first embodiment, the inclined surface height of the reflector 112 with respect to the organic light emitting element 101 (the anode electrode 121) serving as the light emitting portion is adjusted for each sub pixel 100, so that the inclined surface heights of the reflector 112R, the reflector 112W, the reflector 112G, and the reflector 112B are different. Accordingly, in the pixel 10 of the first embodiment, it is possible not only to improve the light extraction efficiency by the light reflecting layer but also to improve the luminance of the specific sub pixel 100 by causing each sub pixel 100 to have different luminance.

Further, in FIG. 5, the example in which the inclined surface height of the reflector 112W is highest, and the inclined surface height decrease in the order of the reflector 112G, the reflector 112R, and the reflector 112B as indicated in Formula (1) has been described, but the relation indicated in Formula (1) is an example, and the order of the inclined surface heights is arbitrary as long as the inclined surface heights of the reflectors 112R, 112W, 112G, and 112B are different from one another.

For example, in a case in which the respective sub pixels 100 in the pixel 10 differ in lifespan, since it is possible to reduce an applied current density by improving the luminance of the sub pixel 100, it is possible to perform an adjustment so that the respective sub pixels 100 have the same lifespan deterioration. In a case in which such an adjustment is performed, the inclined surface height of the reflector 112 can be adjusted for each sub pixel 100 so that, for example, a relation indicated in the following Formula (1)' is satisfied.

Inclined surface height of reflector112$B$>inclined surface height of reflector112$W$>inclined surface height of reflector112$G$>inclined surface height of reflector112$R$     (1)'

Further, in FIG. 5, the sub pixels 100 constituting the pixel 10 are arranged in the order of the sub pixels 100R, 100W, 100G, and 100B from the left side to the right side in FIG. 5, but the arrangement order of the sub pixels 100 is arbitrary. Further, in addition to a case in which the inclined surface height of the reflector 112 is a uniform height like the reflector 112W of the sub pixel 100W as illustrated in FIG. 5, a case in which the inclined surface height of the reflector 112 is not uniform is assumed, but in this case, for example, it is preferable to adjust an average value or the like of the inclined surface height of the reflector 112 for each sub pixel 100.

(Second Example of Structure of Pixel)

Figure 6:
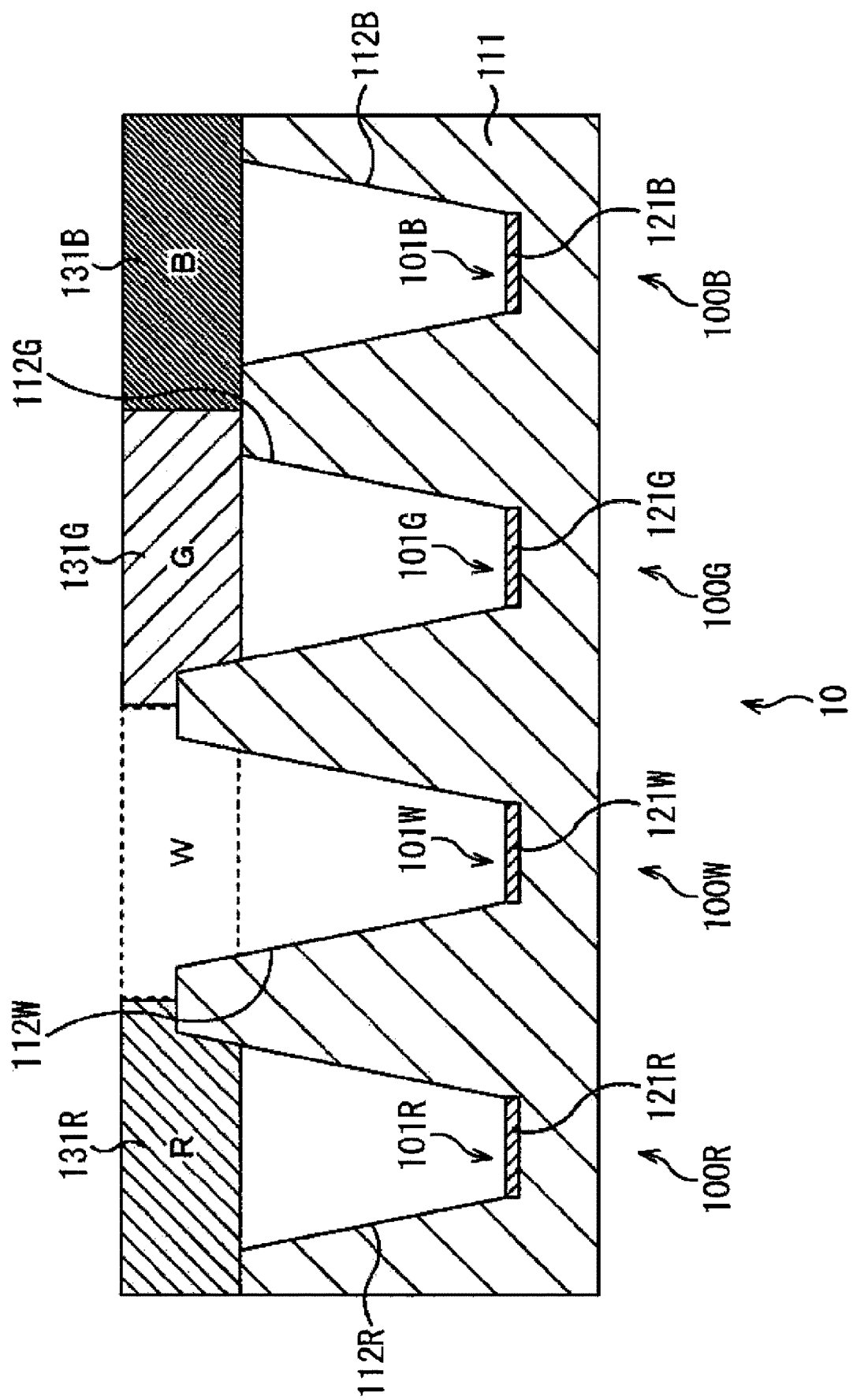
FIG. 6 is a main part cross-sectional view illustrating a part of a structure of a pixel according to a second embodiment.

FIG. 6 is a main part cross-sectional view illustrating a part of a structure of a pixel according to a second embodiment. A structure of a pixel 10 according to the second embodiment will be described below with reference to the main part cross-sectional view.

As illustrated in FIG. 6, in a pixel 10 of a second embodiment, among the four sub pixels 100 including the sub pixel 100R, the sub pixel 100W, the sub pixel 100G, and the sub pixel 100B, an inclined surface height of a reflector 112 of a specific sub pixel 100 is different.

In other words, in the pixel 10 of the second embodiment (FIG. 6), an inclined surface height of a reflector 112 of a specific sub pixel 100 among the four sub pixels 100 is changed without changing the inclined surface height of the reflector 112 for all of the four sub pixels 100 as compared with the pixel 10 of the first embodiment (FIG. 5) described above.

Specifically, in FIG. 6, the inclined surface height of the reflector 112W only in the sub pixel 100W is changed to be higher than the inclined surface heights of the reflectors 112R, 112G, and 112B of the other sub pixels 100R, 100G, and 100B.

In other words, in the pixel 10 of the second embodiment, in a case in which the inclined surface heights of the reflectors 112 in the respective sub pixels 100 are compared, for example, a relation illustrated in the following Formula (2) can be obtained.

Inclined surface height of reflector112$W$>inclined surface height of reflector112$R$=inclined surface height of reflector112$G$=inclined surface height of reflector112$B$     (2)

Here, in Formula (2), the inclined surface height of the reflector 112W corresponds to the height of the inclined surface of the first member 111 in the sub pixel 100W. Similarly, the inclined surface heights of the reflectors 112R, 112G, and 112B correspond to the heights of the inclined surfaces of the first members 111 in the sub pixels 100R, 100G, and 100B.

As described above, in the pixel 10 of the second embodiment, luminance of a specific sub pixel 100 can be increased such that the specific sub pixel 100 among the four sub pixels 100 is formed to differ in the inclined surface height of the reflector 112, and the respective sub pixels 100 differ in luminance. For example, when the inclined surface height of only the reflector 112W of the sub pixel 100W is high, a region in which light from the organic light emitting element 101W (the anode electrode 121W) undergoes total reflection increases, and thus the luminance of the sub pixel 100W is improved, whereby the luminance of the entire pixel 10 can be improved.

Further, in the pixel 10 of the second embodiment, since the inclined surface height of the reflector 112 is changed without changing the light emitting area or the pitch arrangement of each sub pixel 100, each sub pixel 100 has different luminance, and thus it is possible to easily achieve high definition.

As described above, in the pixel 10 of the second embodiment, the inclined surface height of the reflector 112 with respect to the organic light emitting element 101 (the anode electrode 121) serving as the light emitting portion is adjusted for each sub pixel 100 so that only the inclined surface height of the reflector 112 of the specific sub pixel 100 is different from the inclined surface heights of the reflectors 112 of the other sub pixels 100. Accordingly, in the pixel 10 of the second embodiment, it is possible not only to improve the light extraction efficiency by the light reflecting layer but also to improve the luminance of the specific sub pixel 100 by causing each sub pixel 100 to have different luminance.

Further, in FIG. 6, the example in which the inclined surface height of the reflector 112W is highest, and the inclined surface heights of the other reflectors, that is, the reflector 112G, the reflector 112R, and the reflector 112B are equal as indicated in Formula (2) has been described, but the relation indicated in Formula (2) is an example, and the reflector 112 whose inclined surface height is changed is arbitrary as long as the inclined surface height of the reflector 112 of the specific sub pixel 110 is different from the inclined surface heights of the other sub pixels 100.

Here, in a case in which the respective sub pixels 100 in the pixel 10 differ in lifespan, it is possible to perform an adjustment so that the respective sub pixels 100 have the same lifespan deterioration by changing the luminance for each sub pixel 100 as described above, but the inclined surface height of the reflector 112G of the specific sub pixel 100G can be adjusted so that, for example, a relation indicated in the following Formula (2)' is satisfied.

Inclined surface height of reflector112$B$>inclined surface height of reflector112$W$=inclined surface height of reflector112$G$=inclined surface height of reflector112$R$     (2)'

Further, the example in which the inclined surface height of the reflector 112 of one sub pixel 100 as the specific sub pixel 100 is changed has been described, but the number of specific sub pixels 100 may be two or more, for example, the inclined surface heights of the reflectors 112W and 112B of the sub pixels 100W and 100B may be changed.

(Third Example of Structure of Pixel)

Figure 7:
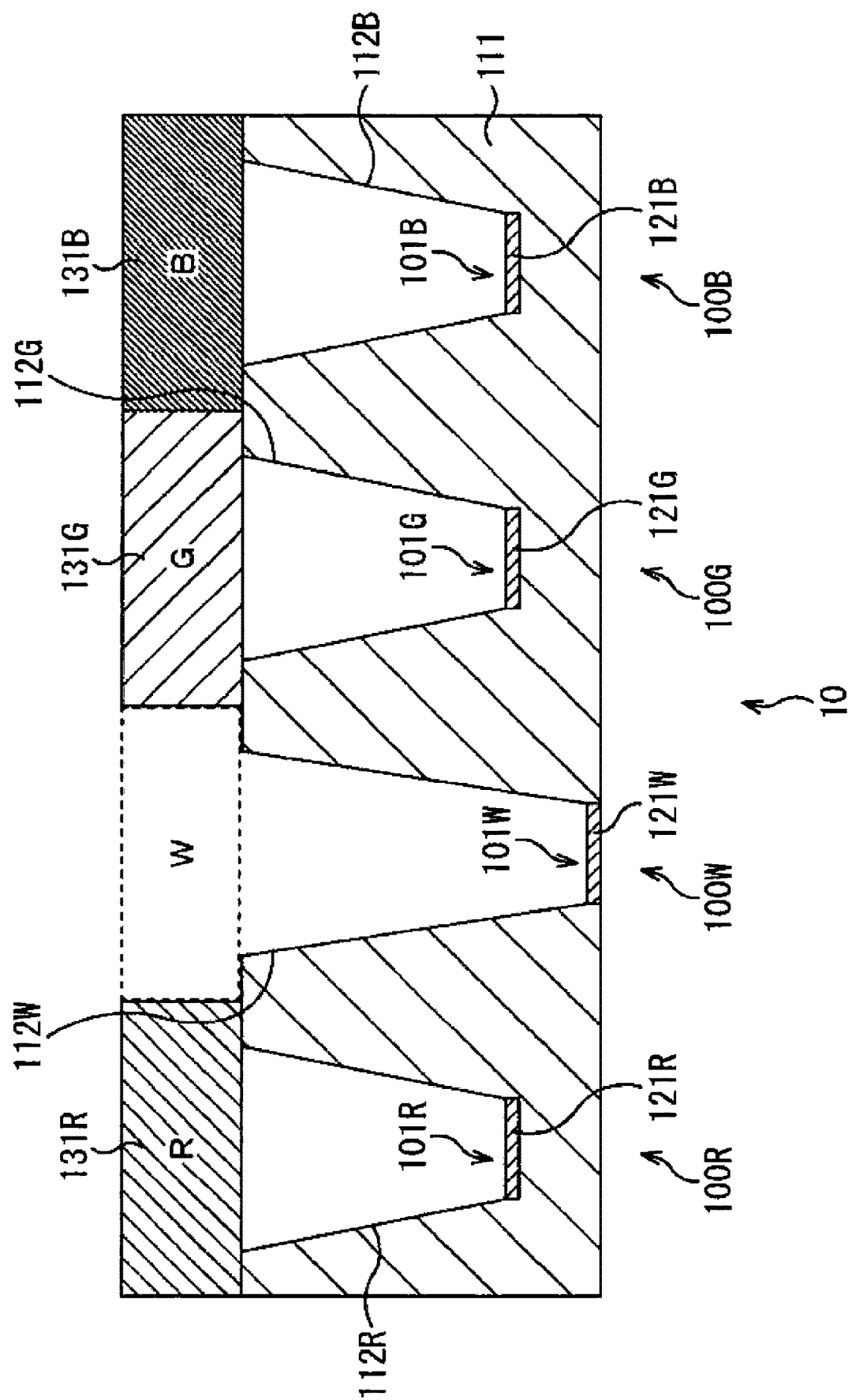
FIG. 7 is a main part cross-sectional view illustrating a part of a structure of a pixel according to a third embodiment.

FIG. 7 is a main part cross-sectional view illustrating a part of a structure of a pixel according to a third embodiment. A structure of a pixel 10 according to the third embodiment will be described below with reference to the main part cross-sectional view.

As illustrated in FIG. 7, in a pixel 10 of a third embodiment, a position of an anode electrode 121 of an organic light emitting element 101 included in a specific sub pixel 100 among the four sub pixels 100 including the sub pixel 100R, the sub pixel 100W, the sub pixel 100G, and the sub pixel 100B is adjusted.

In other words, in the pixel 10 of the third embodiment (FIG. 7), the position of the anode electrode 121 of the organic light emitting element 101 (the position in the stacking direction) is adjusted without adjusting the inclined surface height (the height in the stacking direction) of the reflector 112 in the sub pixel 100 as compared with the pixel 10 of the first embodiment (FIG. 5) described above and the pixel 10 of the second embodiment (FIG. 6).

As described above, the inclined surface height of the reflector 112 with respect to the organic light emitting element 101 (the anode electrode 121) serving as the light emitting portion can be adjusted for each sub pixel 100 by adjusting the position of the organic light emitting element 101 (the anode electrode 121). Accordingly, it is possible to cause the inclined surface height of the reflector 112 of the specific sub pixel 100 to be different from the inclined surface heights of the reflectors 112 of the other sub pixels 100.

Specifically, in FIG. 7, only the anode electrode 121W of the organic light emitting element 101W in the sub pixel 100W is formed with a large depth in the stacking direction, and thus the inclined surface height of the reflector 112W of the sub pixel 100W is higher than the inclined surface heights of the reflectors 112R, 112G, and 112B of the sub pixels 100R, 100G, and 100B.

In other words, in the third embodiment, in a case in which the inclined surface heights of the reflectors 112 in the respective sub pixels 100 are compared, for example, a relation similar to that of Formula (2) described above is obtained.

As described above, in the pixel 10 of the third embodiment, the position of the anode electrode 121 of the organic light emitting element 101 of the specific sub pixel 100 among the four sub pixels 100 is adjusted so that the inclined surface height of the reflector 112 of the specific sub pixel 100 is different, and thus it is possible to cause the respective sub pixels 100 to have different luminances, and it is possible to increase the luminance of the specific sub pixel 100 accordingly.

For example, since the position of the anode electrode 121W of the organic light emitting element 101W of the sub pixel 100W is adjusted so that only the reflector 112W of the sub pixel 100W have a higher inclined surface height, the luminance of the sub pixel 100W is improved, and the luminance of the entire pixel 10 can be improved accordingly.

Further, in the pixel 10 of the third embodiment, since the position of the anode electrode 121 of the organic light emitting element 101 is adjusted without changing the light emitting area or the pitch arrangement of each sub pixel 100, each sub pixel 100 has different luminance, and thus it is possible to easily achieve high definition.

As described above, in the pixel 10 of the third embodiment, the inclined surface height of the reflector 112 with respect to the anode electrode 121 of the organic light emitting element 101 serving as the light emitting portion 101 is adjusted for each sub pixel 100 by adjusting the position of the anode electrode 121 side of the specific sub pixel 100, and thus only the inclined surface height of the reflector 112 of the specific sub pixel 100 is different from the inclined surface heights of the reflectors 112 of the other sub pixels 100. Accordingly, in the pixel 10 of the third embodiment, it is possible not only to improve the light extraction efficiency by the light reflecting layer but also to improve the luminance of the specific sub pixel 100 by causing each sub pixel 100 to have different luminance.

Further, in FIG. 7, the example in which the inclined surface height of the reflector 112W is highest, and the inclined surface heights of the other reflectors, that is, the reflector 112G, the reflector 112R, and the reflector 112B are equal so that the relation similar to that in Formula (2) is obtained has been described, but the relation is an example, and the sub pixel 100 in which the position of the anode electrode 121 side is changed is arbitrary as long as the inclined surface height of the reflector 112 of the specific sub pixel 110 is different from the inclined surface heights of the other sub pixels 100.

Further, the example in which the position of the anode electrode 121 side of one sub pixel 100 as the specific sub pixel 100 is adjusted has been presented here, but, for example, the number of specific sub pixels 100 may be two or more, for example, the positions of the anode electrodes 121W and 121B side of the sub pixels 100W and 100B may be adjusted. Further, the position of the anode electrode 121 side may be adjusted for each sub pixel 100 in the pixel 10 so that, for example, the relation of Formula (1) described above is satisfied.

(Fourth Example of Structure of Pixel)

Figure 8:
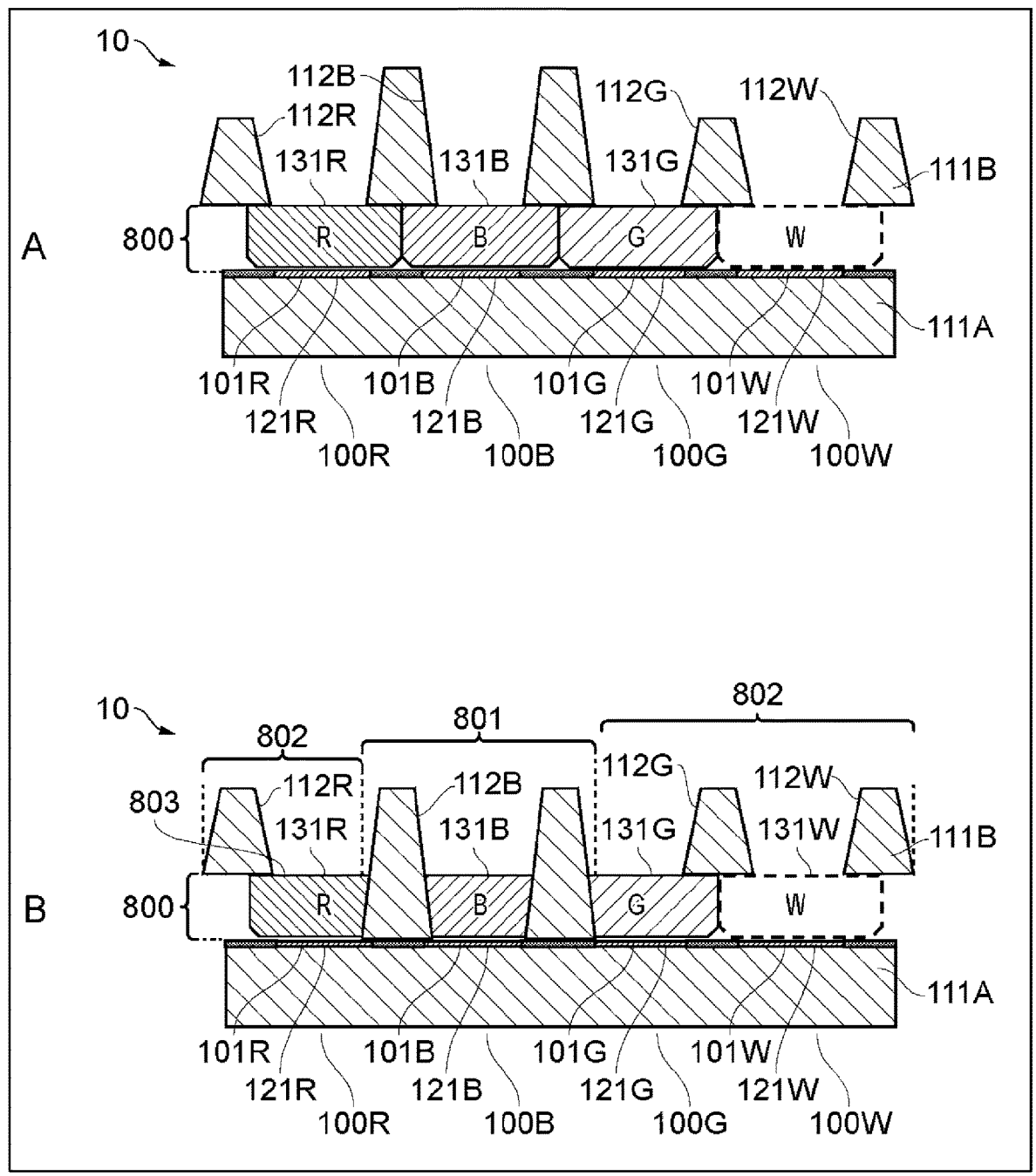
FIGS. 8A and 8B each show a main part cross-sectional view illustrating a part of a structure of a pixel according to variants of a fourth embodiment.

FIGS. 8A and 8B each show a main part cross-sectional view illustrating a part of a structure of a pixel according to variants of a fourth embodiment. A structure of a pixel 10 according to the fourth embodiment will be described below with reference to these main part cross-sectional views.

As illustrated in FIG. 8A, in a pixel 10 of a first variant of the fourth embodiment, the first member 111 comprises a first (lower) portion 111A and a second (upper) portion 111B. The lower portion 111A comprises the light emitting elements 101R, 101B, 101G and 101W of each sub pixel 100R, 100B, 100G and 100W and the upper portion 111B comprises the reflector 112R, 112B, 112G and 112W of each sub pixel 100R, 100B, 100G and 100W. The upper and lower portions 111A and 111B are separated by a gap 800. The gap 800 comprises the color filters 131R, 131B and 131G of each sub pixel 100R, 100B and 100G (the sub pixel 100W does not have a color filter).

The inclined surface height of the reflector of one of the sub pixels (reflector 112B of sub pixel 100B, in this example) is higher than the inclined surface heights of the reflectors of the other sub pixels (reflectors 112R, 112G and 112W of sub pixels 100R, 100G and 100W, in this example). In other words, in a case in which the inclined surface heights of the reflectors 112 in the respective sub pixels 100 are compared, for example, a relation according to Formula (2)' is obtained.

In the pixel 10 of FIG. 8A, the luminance of a specific sub pixel 100 is increased by differing the inclined surface height of the reflector 112 of the specific sub pixel 100 among the four sub pixels 100. For example, when the inclined surface height of the reflector 112B of the sub pixel 100B is higher than that of the other sub pixels (as shown in FIG. 8A), a region in which light from the organic light emitting element 101B undergoes total reflection increases, and thus the luminance of the sub pixel 100B relative to that of the other sub pixels is improved. Further, in the pixel 10 of FIG. 8A, since the inclined surface height of the reflector 112 is changed without changing the light emitting area or the pitch arrangement of each sub pixel 100, it is possible to easily achieve high definition.

As described above, in the pixel 10 of FIG. 8A, the inclined surface height of the reflector 112 with respect to the organic light emitting element 101 serving as the light emitting portion is determined for each sub pixel 100 so that only the inclined surface height of the reflector 112 of the specific sub pixel 100 is different from the inclined surface heights of the reflectors 112 of the other sub pixels 100. Accordingly, in the pixel 10 of FIG. 8A, it is possible not only to improve the light extraction efficiency by the light reflecting layer but also to improve the luminance of the specific sub pixel 100 by causing that sub pixel 100 to have a different luminance. In the case of increasing the luminance of sub pixel 100B using a reflector 112B with a higher inclined surface height relative to that of the other sub pixels 100R, 100G and 100W, each of the sub pixels 100 can achieve the same (or similar) lifespan deterioration.

Further, in FIG. 8A, the example in which the inclined surface height of the reflector 112B is higher than that of the other reflectors and in which the inclined surface heights of the other reflectors (that is, the reflector 112G, the reflector 112R, and the reflector 112W) are equal, as indicated in Formula (2)', has been described. However, the relation indicated in Formula (2)' is an example, and the reflector 112 whose inclined surface height is changed is arbitrary as long as the inclined surface height of the reflector 112 of the specific sub pixel 100 is different from the inclined surface heights of the other sub pixels 100. For example, the relation of inclined surface heights indicated in Formula (2) could be used (thereby increasing the luminance of the sub pixel 100W to increase the luminance of the pixel 10 as a whole).

Further, an example in which the inclined surface height of the reflector 112 of one sub pixel 100 as the specific sub pixel 100 is changed has been described, but the number of specific sub pixels 100 may be two or more. For example, the inclined surface heights of both the reflectors 112W and 112B of the sub pixels 100W and 100B may be made equal to each other and higher than the inclined surface heights of the reflectors 112R and 112G of the sub pixels 100R and 100G. It will also be appreciated that, more generally, each reflector 112 (or, at least, each of a portion of the reflectors 112) may have a different respective inclined surface height.

As illustrated in FIG. 8B, in a pixel 10 of a second variant of the fourth embodiment, only a portion of the upper portion 111B is separated from the lower portion IIIA by the gap 800 whilst the remaining portion of the upper portion 111B is not separated from (that is, is connected to) the lower portion 111A. In particular, a portion 801 of the upper portion 111B comprising the reflector of one of the sub pixels (reflector 112B of sub pixel 100B, in this example) is not separated from the lower portion 111A (that is, the portion 801 is connected to the lower portion 111A) whereas another portion 802 of the upper portion 111B comprising at least part of each of the reflectors of the other sub pixels (reflectors 112R, 112G and 112W of sub pixels 100R, 100G and 100W, in this example) is separated from the lower portion 111A (that is, the portion 802 is not connected to the lower portion 111A). In the example of FIG. 8B, the reflector 112B of the portion 801 of the upper portion 111B extends through part of the color filter 131B of the sub pixel 100B and part of the neighboring color filters 131R and 131G of the sub pixels 100R and 100G in order to connect with the lower portion 111A.

Due to there being a gap 800 between the portion 802 of the upper portion 111B and the lower portion 111A but no gap 800 between the portion 801 of the upper portion 111B and the lower portion 111A (for a given reflector height as measured from a top surface 803 of the color filters 131), the surface area of the inclined surface of the reflector comprised by the portion 801 (reflector 112B of sub pixel 100B, in this example) is greater than the surface area of the inclined surface of the reflectors of which at least a part is comprised by the portion 802 (reflectors 112R, 112G and 112W of sub pixels 100R, 100G and 100W, in this example).

In the pixel 10 of FIG. 8B, the luminance of a specific sub pixel 100 is increased because of the differing inclined surface area of the reflector 112 of the specific sub pixel 100 among the four sub pixels 100. For example, when the inclined surface area of the reflector 112B of the sub pixel 100B is higher that of the other sub pixels (as shown in FIG. 8B), a region in which light from the organic light emitting element 101B undergoes total reflection increases, and thus the luminance of the sub pixel 100B relative to that of the other sub pixels is improved. Further, in the pixel 10 of FIG. 8B, since the inclined surface area of the reflector 112 is changed without changing the light emitting area or the pitch arrangement of each sub pixel 100, it is possible to easily achieve high definition.

As described above, in the pixel 10 of FIG. 8B, the inclined surface area of the reflector 112 with respect to the organic light emitting element 101 serving as the light emitting portion is determined for each sub pixel 100 so that only the inclined surface area of the reflector 112 of the specific sub pixel 100 is different from the inclined surface areas of the reflectors 112 of the other sub pixels 100. Accordingly, in the pixel 10 of FIG. 8B, it is possible not only to improve the light extraction efficiency by the light reflecting layer but also to improve the luminance of the specific sub pixel 100 by causing that sub pixel 100 to have a different luminance. In the case of increasing the luminance of sub pixel 100B using a reflector 112B with a higher inclined surface area relative to that of the other sub pixels 100R, 100O and 100W, each of the sub pixels 100 can achieve the same (or similar) lifespan deterioration.

Further, in FIG. 8B, the example in which the inclined surface area of the reflector 112B is higher than that of the other reflectors and in which the inclined surface areas of the other reflectors (that is, the reflector 112G, the reflector 112R, and the reflector 112W) are equal has been described. However, this is only an example, and the reflector 112 whose inclined surface area is changed (by determining which portion(s) of the upper portion 111B are connected to the lower portion 111A and which are not) is arbitrary as long as the inclined surface area of the reflector 112 of the specific sub pixel 100 is different from the inclined surface areas of the other sub pixels 100. For example, the reflector 112W of the sub pixel 100W may have the largest inclined surface area and the other sub pixels may have smaller, equal inclined surface areas (thereby increasing the luminance of the sub pixel 100W and increasing the luminance of the pixel 10 as a whole).

Further, an example in which the inclined surface area of the reflector 112 of one sub pixel 100 as the specific sub pixel 100 is changed has been described, but the number of specific sub pixels 100 may be two or more, for example, the inclined surface areas of both the reflectors 112W and 112B of the sub pixels 100W and 100B may be made equal to each other and higher than the inclined surface areas of the reflectors 112R and 112G of the sub pixels 100R and 100G. It will also be appreciated that, more generally, each reflector 112 (or, at least, each of a portion of the reflectors 112) may have a different respective inclined surface area (e.g. by adjusting the size of the gap between each reflector 112 and the lower portion 111A).

(Fifth Example of Structure of Pixel)

Figure 9:
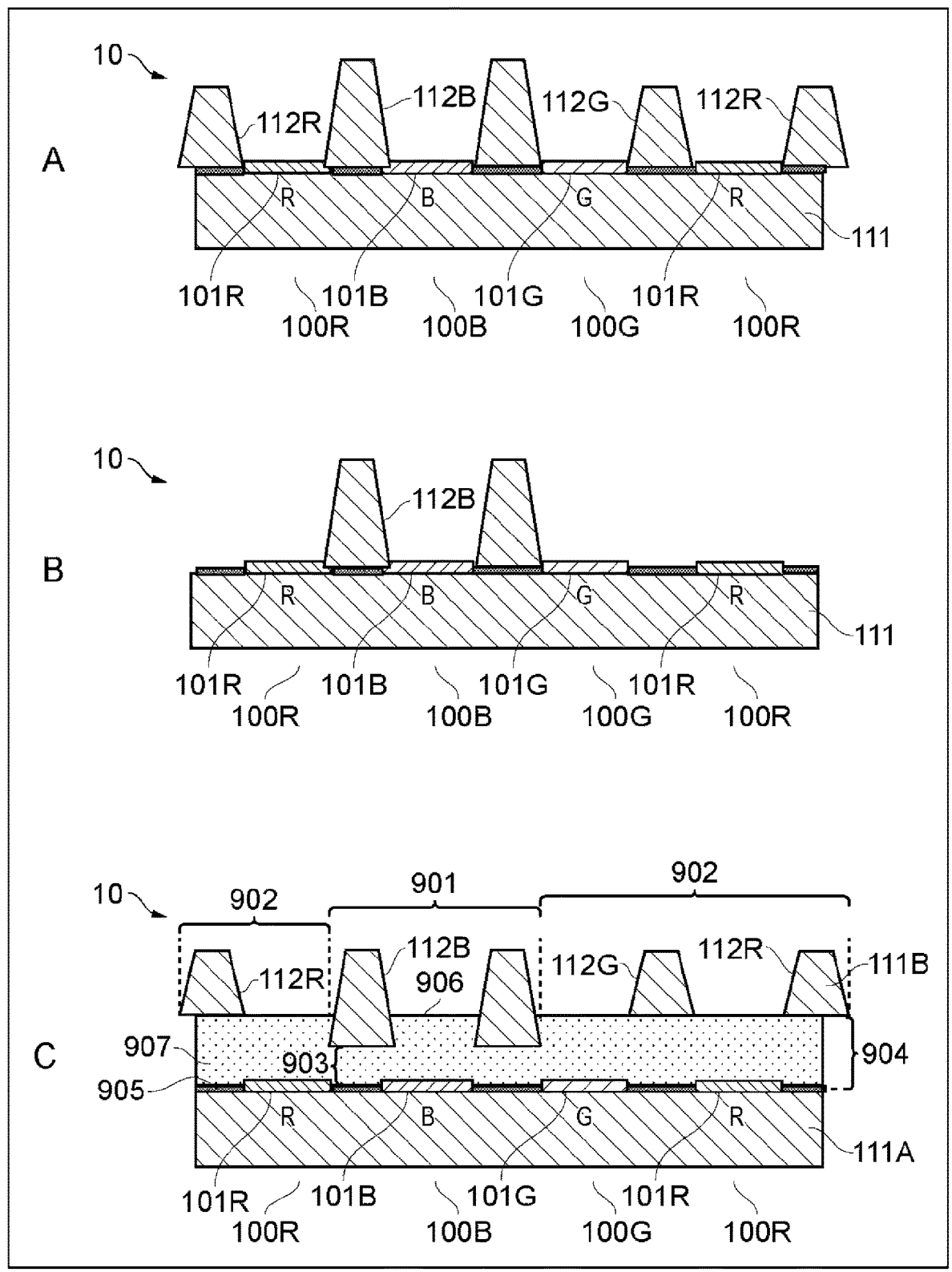
FIGS. 9A, 9B and 9C each show a main part cross-sectional view illustrating a part of a structure of a pixel according to variants of a fifth embodiment.

FIGS. 9A, 9B and 9C each show a main part cross-sectional view illustrating a part of a structure of a pixel according to variants of a fifth embodiment. A structure of a pixel 10 according to the fifth embodiment will be described below with reference to these main part cross-sectional views.

In the above-mentioned embodiments, each organic light emitting element 101 employs a structure that emits white light which (where necessary) then travels through a color filter (e.g. for sub pixels 100R, 100B and 100G). Alternatively, each organic light emitting element 101 may emit a specific color of light (rather than white light). Thus, for example, there may be a red light emitting element 101R emitting red light, a blue light emitting element 101B emitting blue light and a green light emitting element 101G emitting green light. In this case, no color filters are required because the light emitted from each light emitting element 101 is already the desired color.

The pixels 10 of the fifth embodiment use such colored light emitting elements 101. These colored light emitting elements are structurally similar to the white light emitting elements of the above-mentioned embodiments, except that the organic layer of each light emitting element includes a light emitting layer made of an organic light emitting material which emits colored (rather than white) light. In particular, the relative positions of the anode, cathode and organic layer of each light emitting element (not shown) are the same as previously described for the white light emitting elements of the above-mentioned embodiments.

In the embodiments of FIGS. 9A, 9B and 9C, each light emitting element 101 is a colored light emitting element and there is no white light emitting element. Furthermore, each pixel 10 may comprise a plurality of light emitting elements of a certain color (in this case, each pixel 10 comprises two red light emitting elements 101R).

As illustrated in FIG. 9A, in a pixel 10 of a first variant of the fifth embodiment, the first member 111 comprises a reflector 112R, 112B and 112G of each sub pixel 100R, 100B and 100G. The inclined surface height of the reflector of one of the sub pixels (reflector 112B of sub pixel 100B, in this example) is higher than the inclined surface heights of the reflectors of the other sub pixels (reflectors 112R and 112G of sub pixels 100R and 100G, in this example). The inclined surface heights of the reflectors of the other sub pixels are equal to each other.

In the pixel 10 of FIG. 9A, the luminance of a specific sub pixel 100 is increased by differing the inclined surface height of the reflector 112 of the specific sub pixel 100 among the four sub pixels 100. For example, when the inclined surface height of the reflector 112B of the sub pixel 100B is higher than that of the other sub pixels (as shown in FIG. 9A), a region in which light from the organic light emitting element 101B undergoes total reflection increases, and thus the luminance of the sub pixel 100B relative to that of the other sub pixels is improved. Further, in the pixel 10 of FIG. 9A, since the inclined surface height of the reflector 112 is changed without changing the light emitting area or the pitch arrangement of each sub pixel 100, it is possible to easily achieve high definition.

As described above, in the pixel 10 of FIG. 9A, the inclined surface height of the reflector 112 with respect to the organic light emitting element 101 serving as the light emitting portion is determined for each sub pixel 100 so that only the inclined surface height of the reflector 112 of the specific sub pixel 100 is different from the inclined surface heights of the reflectors 112 of the other sub pixels 100. Accordingly, in the pixel 10 of FIG. 9A, it is possible not only to improve the light extraction efficiency by the light reflecting layer but also to improve the luminance of the specific sub pixel 100 by causing that sub pixel 100 to have a different luminance. In the case of increasing the luminance of sub pixel 100B using a reflector 112B with a higher inclined surface height relative to that of the other sub pixels 100R and 100G, each of the sub pixels 100 can achieve the same (or similar) lifespan deterioration.

Further, in FIG. 9A, the example in which the inclined surface height of the reflector 112B is higher than that of the other reflectors and in which the inclined surface height of the other reflectors (that is, the reflector 112G and the reflector 112R) are equal has been described. However, this is only an example, and the reflector 112 whose inclined surface height is changed is arbitrary as long as the inclined surface height of the reflector 112 of the specific sub pixel 100 is different from the inclined surface heights of the other sub pixels 100.

Further, an example in which the inclined surface height of the reflector 112 of one sub pixel 100 as the specific sub pixel 100 is changed has been described, but the number of specific sub pixels 100 may be two or more, for example, the inclined surface heights of both the reflectors 112G and 112B of the sub pixels 100G and 100B may be made equal to each other and higher than the inclined surface heights of the reflectors 112R of the sub pixels 100R. It will also be appreciated that, more generally, each reflector 112 (or, at least, each of a portion of the reflectors 112) may have a different respective inclined surface height.

As illustrated in FIG. 9B, in a pixel 10 of a second variant of the fifth embodiment, the first member 111 comprises a reflector for only one of the sub pixels (reflector 112B of sub pixel 100B, in this example).

In the pixel 10 of FIG. 9B, the luminance of a specific sub pixel 100 is increased by providing a reflector 112 only for that specific sub pixel 100 among the four sub pixels 100. For example, when a reflector 112B for sub pixel 100B is provided, a region in which light from the organic light emitting element 101B undergoes total reflection increases, and thus the luminance of the sub pixel 100B relative to that of the other sub pixels is improved. Further, in the pixel 10 of FIG. 9B, since the reflector 112 of the specific sub pixel is provided without changing the light emitting area or the pitch arrangement of each sub pixel 100, it is possible to easily achieve high definition.

In the pixel 10 of FIG. 9B, it is possible not only to improve the light extraction efficiency by the light reflecting layer but also to improve the luminance of the specific sub pixel 100 by causing that sub pixel 100 to have a different luminance. In the case of increasing the luminance of sub pixel 100B using a reflector 112B (without using a reflector for the other sub pixels 100R and 100G), each of the sub pixels 100 can achieve the same (or similar) lifespan deterioration.

In the pixel 10 of FIG. 9B, an example in which a reflector 112B is provided only for sub pixel 100B has been described. However, this is only an example, and the sub pixel 100 to which a reflector 112 is provided may be a different sub pixel.

In the pixel 10 of FIG. 9B, an example in which a reflector 112 is provided only to one specific sub pixel 100 has been described. However, the number of specific sub pixels 100 may be two or more. That is, more generally, a reflector 112 may be provided to a portion of the sub pixels 100 of a pixel 10 whereas a remaining portion of the sub pixels 100 of the pixel 10 are not provided with a reflector 112. This improves the luminance of the specific sub pixels 100 to which a reflector 112 is provided.

As illustrated in FIG. 9C, in a pixel 10 of a third variant of the fifth embodiment, the first member 111 comprises a first (lower) portion 111A and a second (upper) portion 111B. The lower portion 111A comprises the light emitting elements 101R, 101B and 101G of each sub pixel 100R, 100B and 100G and the upper portion 111B comprises a reflector 112R, 112B and 112G of each sub pixel 100R, 100B and 100G.

The lower and upper portions 111A and 111B are separated by a gap which varies in size for different respective facing portions of the lower and upper portions 111A and 111B. In the example of FIG. 9C, the size of the gap 903 between a portion 901 of the upper portion 111B comprising the reflector of one of the sub pixels (reflector 112B of sub pixel 100B, in this example) and the lower portion 111A is smaller than the size of the gap 904 between another portion 902 of the upper portion 111B comprising at least part of each of the reflectors of the other sub pixels (reflectors 112R and 112G of sub pixels 100R and 100G, in this example) and the lower portion 111A. In the example of FIG. 9C, the surface 905 of the lower portion 111A facing the upper portion 111B comprises a planarized layer 907 into which the portions 901 and 902 of the upper portion 111B are embedded at different positions with respect to the lower portion 111A so as to provide the gaps of different sizes between the portions 901 and 902 of the upper portion 111B and the lower portion 111A. The planarized layer 907 is formed of a transmissive material through which light emitted by each of the light emitting elements 101R, 101B and 101G can pass. The planarized layer 907 may be formed of, for example, a resin such as an acrylic resin, a polyimide resin, a silicon resin or the like.

Due to there being a gap of a greater size between the portion 902 of the upper portion 111B and the lower portion 111A and a gap of a smaller size between the portion 901 of the upper portion 111B and the lower portion 111A (for a given reflector height as measured from a top surface 906 of the planarized layer 907), the surface area of the inclined surface of the reflector comprised by the portion 901 (reflector 112B of sub pixel 100B, in this example) is greater than the surface area of the inclined surface of the reflectors of which at least a part is comprised by the portion 902 (reflectors 112R and 112G of sub pixels 100R and 100G).

In the pixel 10 of FIG. 9C, the luminance of a specific sub pixel 100 is increased because of the differing inclined surface area of the reflector 112 of the specific sub pixel 100 among the four sub pixels 100. For example, when the inclined surface area of the reflector 112B of the sub pixel 100B is higher that of the other sub pixels (as shown in FIG. 9C), a region in which light from the organic light emitting element 101B undergoes total reflection increases, and thus the luminance of the sub pixel 100B relative to that of the other sub pixels is improved. Further, in the pixel 10 of FIG. 9C, since the inclined surface area of the reflector 112 is changed without changing the light emitting area or the pitch arrangement of each sub pixel 100, it is possible to easily achieve high definition.

As described above, in the pixel 10 of FIG. 9C, the inclined surface area of the reflector 112 with respect to the organic light emitting element 101 serving as the light emitting portion is determined for each sub pixel 100 so that only the inclined surface area of the reflector 112 of the specific sub pixel 100 is different from the inclined surface areas of the reflectors 112 of the other sub pixels 100. Accordingly, in the pixel 10 of FIG. 9C, it is possible not only to improve the light extraction efficiency by the light reflecting layer but also to improve the luminance of the specific sub pixel 100 by causing that sub pixel 100 to have a different luminance. In the case of increasing the luminance of sub pixel 100B using a reflector 112B with a higher inclined surface area relative to that of the other sub pixels 100R and 100G, each of the sub pixels 100 can achieve the same (or similar) lifespan deterioration.

Further, in FIG. 9C, the example in which the inclined surface area of the reflector 112B is higher than that of the other reflectors and in which the inclined surface areas of the other reflectors (that is, the reflector 112G and the reflector 112R) are equal has been described. However, this is only an example, and the reflector 112 whose inclined surface area is changed (by determining the size of the gap between the portion of the upper portion 111B comprising that reflector 112 and the lower portion 111A) is arbitrary as long as the inclined surface area of the reflector 112 of the specific sub pixel 100 is different from the inclined surface areas of the other sub pixels 100.

Further, an example in which the inclined surface area of the reflector 112 of one sub pixel 100 as the specific sub pixel 100 is changed has been described, but the number of specific sub pixels 100 may be two or more. That is, more generally, the size of the gap between the upper portion 111B and lower portion 111A of the first member 111 may be varied such that the inclined surface area of the reflector of a portion of the sub pixels 100 of a pixel 10 is greater than that of the reflector of a remaining portion of the sub pixels 100 of the pixel 10. This improves the luminance of the specific sub pixels 100 to which a reflector 112 with a greater inclined surface area is provided. It will also be appreciated that, more generally, each reflector 112 (or, at least, each of a portion of the reflectors 112) may have a different respective inclined surface area (e.g. by adjusting the size of the gap between each reflector 112 and the lower portion 111A).

(Sixth Example of Structure of Pixel)

Figure 10:
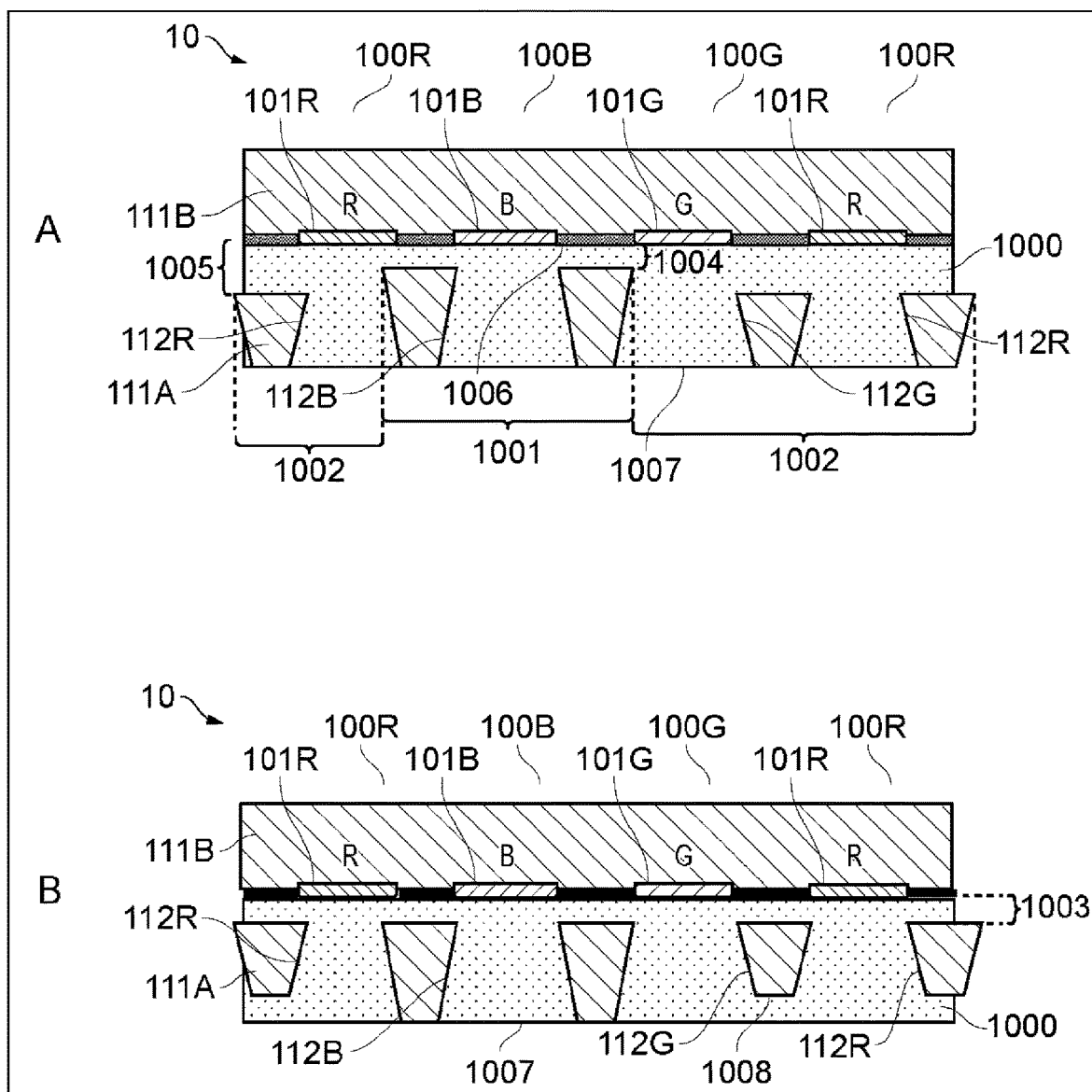
FIGS. 10A and 10B each show a main part cross-sectional view illustrating a part of a structure of a pixel according to variants of a sixth embodiment.

FIGS. 10A and 10B each show a main part cross-sectional view illustrating a part of a structure of a pixel according to variants of a sixth embodiment. A structure of a pixel 10 according to the sixth embodiment will be described below with reference to these main part cross-sectional views.

In the above-mentioned embodiments, the light emitting element 101 of each sub pixel 100 comprises an organic layer with a structure sandwiched between an anode electrode and a cathode electrode (the cathode being above the anode in the FIGS). The cathode (formed of ITO, for example) is transparent so that light emitted by the organic layer is transmitted through the cathode to the reflector 112 of that sub pixel 100. On the other hand, the anode (formed of Al, Cu or the like, for example) is reflective so that light emitted by the organic layer is reflected by the anode rather than being transmitted through it. Such an arrangement is known as a top emission OLED display type. The present technology is not limited to such an arrangement, however. In an alternative embodiment, it is the anode which is transparent and the cathode which is reflective so that light emitted by the organic layer of each sub pixel 100 is transmitted through the anode to the reflector 112 of that sub pixel 100 but is reflected by the cathode rather than being transmitted through it. In this case, the anode is formed of ITO, for example, and the cathode is formed of Al, Cu or the like, for example. Such an arrangement is known as a bottom emission OLED type. The variants of the sixth embodiment shown in FIGS. 10A and 10B represent example bottom emission OLED type pixels.

As illustrated in FIG. 10A, in a pixel 10 of a first variant of the sixth embodiment, the first member 111 comprises a first (lower) portion 111A and a second (upper) portion 111B. The upper portion 111B comprises the light emitting elements 101R, 101B and 101G of each sub pixel 100R, 100B and 100G and the lower portion 111A comprises a reflector 112R, 112B and 112G of each sub pixel 100R, 100B and 100G.

The lower and upper portions 111A and 111B are separated by a gap which varies in size for different respective facing portions of the lower and upper portions 111A and 111B. In the example of FIG. 10A, the size of the gap 1004 between a portion 1001 of the lower portion 111A comprising the reflector of one of the sub pixels (reflector 112B of sub pixel 100B, in this example) and the upper portion 111B is smaller than the size of the gap 1005 between another portion 1002 of the lower portion 111A comprising at least part of each of the reflectors of the other sub pixels (reflectors 112R and 112G of sub pixels 100R and 100G in this example) and the upper portion 111B. In the example of FIG. 10A, the surface 1006 of the upper portion 111B facing the lower portion 111A comprises a planarized layer 1000 into which the portions 1001 and 1002 of the lower portion 111A are embedded at different positions with respect to the upper portion 111B so as to provide the gaps of different sizes between the portions 1001 and 1002 of the lower portion 111A and the upper portion 111B. The planarized layer 1000 is formed of a transmissive material through which light emitted by each of the light emitting elements 101R, 101B and 101G can pass. The planarized layer 1000 may be formed of, for example, a resin such as an acrylic resin, a polyimide resin, a silicon resin or the like.

Due to there being a gap 1005 of a greater size between the portion 1002 of the lower portion 111A and the upper portion 111B and a gap 1004 of a smaller size between the portion 1001 of the lower portion 111A and the upper portion 111B (and given that each reflector of the lower portion 111A extends to a bottom surface 1007 of the planarized layer 1000), the surface area of the inclined surface of the reflector comprised by the portion 1001 (reflector 112B of sub pixel 100B, in this example) is greater than the surface area of the inclined surface of the reflectors of which at least a part is comprised by the portion 1002 (reflectors 112R and 112G of sub pixels 100R and 100G, this this example).

In the pixel 10 of FIG. 10A, the luminance of a specific sub pixel 100 is increased because of the differing inclined surface area of the reflector 112 of the specific sub pixel 100 among the four sub pixels 100. For example, when the inclined surface area of the reflector 112B of the sub pixel 100B is higher than that of the other sub pixels (as shown in FIG. 10A), a region in which light from the organic light emitting element 101B undergoes total reflection increases, and thus the luminance of the sub pixel 100B relative to that of the other sub pixels is improved. Further, in the pixel 10 of FIG. 10A, since the inclined surface area of the reflector 112 is changed without changing the light emitting area or the pitch arrangement of each sub pixel 100, it is possible to easily achieve high definition.

As described above, in the pixel 10 of FIG. 10A, the inclined surface area of the reflector 112 with respect to the organic light emitting element 101 serving as the light emitting portion is determined for each sub pixel 100 so that only the inclined surface area of the reflector 112 of the specific sub pixel 100 is different from the inclined surface areas of the reflectors 112 of the other sub pixels 100. Accordingly, in the pixel 10 of FIG. 10A, it is possible not only to improve the light extraction efficiency by the light reflecting layer but also to improve the luminance of the specific sub pixel 100 by causing that sub pixel 100 to have a different luminance. In the case of increasing the luminance of sub pixel 100B using a reflector 112B with a higher inclined surface area relative to that of the other sub pixels 100R and 100G, each of the sub pixels 100 can achieve the same (or similar) lifespan deterioration.

Further, in FIG. 10A, the example in which the inclined surface area of the reflector 112B is higher than that of the other reflectors and in which the inclined surface areas of the other reflectors (that is, the reflector 112G and the reflector 112R) are equal has been described. However, this is only an example, and the reflector 112 whose inclined surface area is changed (by determining the size of the gap between the portion of the lower portion 111A comprising that reflector 112 and the upper portion 111A) is arbitrary as long as the inclined surface area of the reflector 112 of the specific sub pixel 100 is different from the inclined surface areas of the other sub pixels 100.

Further, an example in which the inclined surface area of the reflector 112 of one sub pixel 100 as the specific sub pixel 100 is changed has been described, but the number of specific sub pixels 100 may be two or more. That is, more generally, the size of the gap between the upper portion 111B and lower portion 111A of the first member 111 may be varied such that the inclined surface area of the reflector of a portion of the sub pixels 100 of a pixel 10 is greater than that of the reflector of a remaining portion of the sub pixels 100 of the pixel 10. This improves the luminance of the specific sub pixels 100 to which a reflector 112 with a greater inclined surface area is provided. It will also be appreciated that, more generally, each reflector 112 (or, at least, each of a portion of the reflectors 112) may have a different respective inclined surface area (e.g. by adjusting the size of the gap between each reflector 112 and the upper portion 111B). Alternatively, each reflector may have the same inclined surface area (e.g. by ensuring that the size of the gap between each of the reflectors 112 and the upper portion 111B is the same), thereby providing an equally improved luminance of each of the sub pixels 100 and thus an improved overall luminance of the pixel 10.

FIG. 10B shows a pixel 10 of a second variant of the sixth embodiment. The pixel 10 of FIG. 10B is the same as that of FIG. 10A, except that the lower and upper portions 111A and 111B of the first member 111 are separated by a gap 1003 of a constant size and that the reflector of one of the sub pixels (reflector 112B of sub pixel 100B, in this example) extends in a direction towards the bottom surface 1007 of the planarized layer 1000 to a greater extent than the extent to which the reflectors of the other sub pixels (reflectors 112R and 112G of sub pixels 100R and 100G, in this example) extend towards the bottom surface 1007 of the planarized layer 1000. The extent to which a reflector 112 extends towards the bottom surface 1007 of the planarized layer 1000 may be referred to as the reflector depth. A reflector 112 (e.g. reflector 112B) which extends towards the bottom surface 1007 of the planarised layer 1000 to a greater extent (so that the distance between a lower end 1008 of the reflector 112 and the bottom surface 1007 of the planarised layer 1000 is smaller) is said to have a greater depth. A reflector 112 (e.g. reflectors 112R and 112G) which extends towards the bottom surface 1007 of the planarised layer 1000 to a lesser extent (so that the distance between a lower end 1008 of the reflector 112 and the bottom surface 1007 of the planarised layer 1000 is smaller) is said to have a lesser depth. In the example of FIG. 10B, the reflector depths of the reflectors other than the reflector 112B with the deepest reflector depth are equal to each other.

In the pixel 10 of FIG. 10B, the luminance of a specific sub pixel 100 is increased by differing the reflector depth of the reflector 112 of the specific sub pixel 100 among the four sub pixels 100. For example, when the reflector depth of the reflector 112B of the sub pixel 100B is greater than that of the other sub pixels (as shown in FIG. 10B), a region in which light from the organic light emitting element 101B undergoes total reflection increases. This is because the greater reflector depth provides a greater surface area of the reflector from which light emitted by the light emitting element 101B is reflected. The luminance of the sub pixel 100B relative to that of the other sub pixels is therefore improved. Further, in the pixel 10 of FIG. 10B, since the reflector depth of the reflector 112 is changed without changing the light emitting area or the pitch arrangement of each sub pixel 100, it is possible to easily achieve high definition.

As described above, in the pixel 10 of FIG. 10B, the reflector depth of the reflector 112 with respect to the organic light emitting element 101 serving as the light emitting portion is determined for each sub pixel 100 so that only the reflector depth of the reflector 112 of the specific sub pixel 100 is different from the reflector depth of the reflectors 112 of the other sub pixels 100. Accordingly, in the pixel 10 of FIG. 10B, it is possible not only to improve the light extraction efficiency by the light reflecting layer but also to improve the luminance of the specific sub pixel 100 by causing that sub pixel 100 to have a different luminance. In the case of increasing the luminance of sub pixel 100B using a reflector 112B with a reflector depth relative to that of the other sub pixels 100R and 100G, each of the sub pixels 100 can achieve the same (or similar) lifespan deterioration.

Further, in FIG. 10B, the example in which the reflector depth of the reflector 112B is greater than that of the other reflectors and in which the reflector depth of the other reflectors (that is, the reflector 112G and the reflector 112R) are equal has been described. However, this is only an example, and the reflector 112 whose reflector depth is changed is arbitrary as long as the reflector depth of the reflector 112 of the specific sub pixel 100 is different from the reflector depths of the other sub pixels 100.

Further, an example in which the reflector depth of the reflector 112 of one sub pixel 100 as the specific sub pixel 100 is changed has been described, but the number of specific sub pixels 100 may be two or more. For example, the reflector depths of both the reflectors 112G and 112B of the sub pixels 100G and 100B may be made equal to each other and greater than the reflector depths of the reflectors 112R of the sub pixels 100R. It will also be appreciated that, more generally, each reflector 112 (or, at least, each of a portion of the reflectors 112) may have a different respective reflector depth. Alternatively, each reflector may have the same reflector depth, thereby providing an equally improved luminance of each of the sub pixels 100 and thus an improved overall luminance of the pixel 10.

Although the pixels 10 of FIGS. 10A and 10B use colored light emitting elements 101R, 101B and 101G, it will be appreciated that, alternatively, white light emitting elements 101R, 101B and 101G could be used. In this case, the pixel 10 comprises a further layer attached to the bottom surface 1007 of the planarized layer 1000 comprising appropriate color filters (like those shown in FIGS. 5, 6, 7 and 8A and 8B, for example). In such a layer, a red color filter (e.g. color filter 101R) is aligned with the light emitting elements 101R, a blue color filter (e.g. color filter 131B) is aligned with the light emitting element 101B and a green color filter (e.g. color filter 131G) is aligned with light emitting element 101G.

(Seventh Example of Structure of Pixel)

Figure 11:
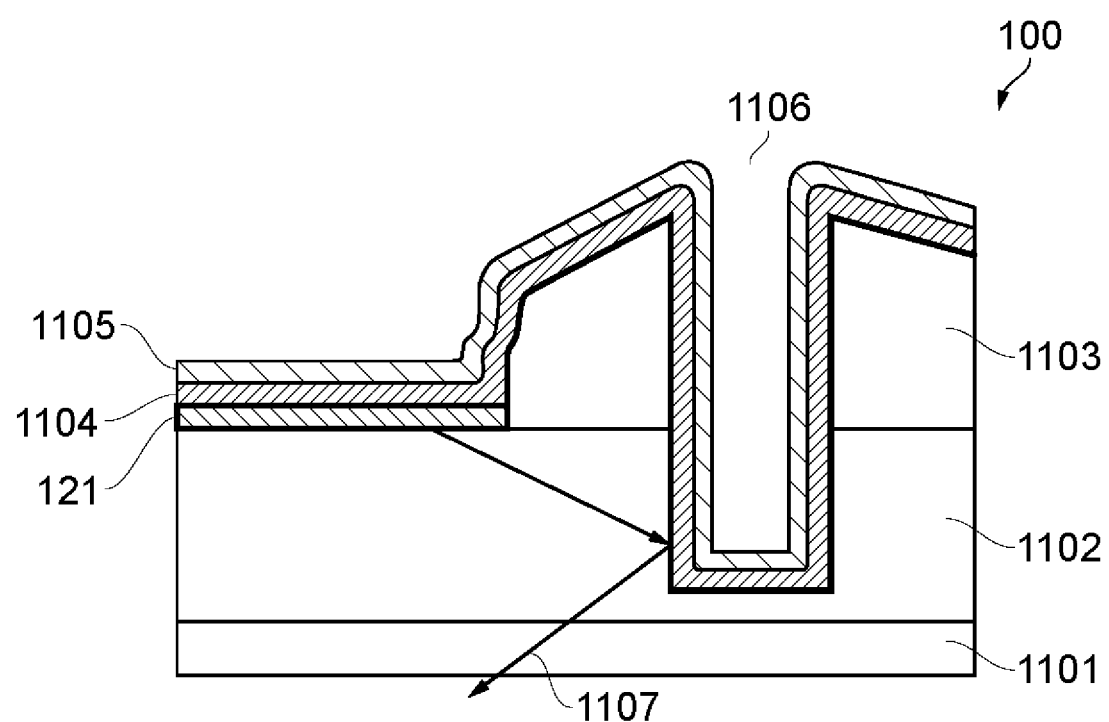
FIG. 11 shows a main part cross-sectional view illustrating a part of a structure of a bottom emission sub pixel 100 according to a seventh embodiment.

FIG. 11 shows a main part cross-sectional view illustrating a part of a structure of a bottom emission sub pixel 100 according to a seventh embodiment. In a pixel comprising a plurality of sub pixels 100 according to the seventh embodiment, each sub pixel 100 comprises the structure shown in FIG. 11.

The sub pixel 100 comprises a substrate 1101 comprising the necessary pixel circuitry (not shown). The substrate 1101 is a thin film transistor (TFT) substrate, for example. A planarized layer 1102 is formed on the substrate 1101. The planarized layer 1102 is formed of, for example, a resin such as an acrylic resin, a polyimide resin, a silicon resin or the like. An anode 121 is formed over a first portion of the planarized layer 1102. An insulating layer 1103 is formed over a second portion of the planarized layer 1102. The insulating layer 1103 is formed of an insulating material. Like the planarized layer 1102, the insulating layer 1103 may be formed of, for example, a resin such as an acrylic resin, a polyimide resin, a silicon resin or the like. The planarized layer 1102 and insulating layer 1103 may be made of the same or different materials. A groove 1106 is formed over a third portion of the planarized layer 1102. The groove 1106 extends through the insulating layer 1103 and into the planarized layer 1102. An organic layer 1104 (comprising a light emitting layer) and a cathode layer 1105 are formed as adjacent layers (forming a combined layer) over the anode 121, insulating layer 1103 and the inside surface of the groove 1106.

In the bottom emission pixel of FIG. 11, the anode 121 (formed of ITO, for example) is transparent. On the other hand, the cathode 1105 (formed of Al, Cu or the like, for example) is reflective. The formation of the organic layer 1104 and cathode 1105 over the anode 121 (so that the organic layer 1104 is sandwiched between the anode 121 and cathode 1105) causes a portion of the organic layer 1104 to be in contact with both the anode 121 and the cathode 1105. Light is therefore emitted by this portion of the organic layer 1104 which, together with the anode 121 and corresponding portion of the cathode 1105, thus forms a light emitting element.

Light rays 1107 emitted by this light emitting element travel through the anode 121 and planarized layer 1102 and are reflected at one or more of the boundary between the planarized layer 1102 (with a first refractive index) and the organic layer 14 (with a second refractive index), the boundary between the organic layer 1104 and the cathode 1105 (with a third refractive index), and the reflective cathode 1105.

In an embodiment, a pixel comprising sub pixels 100 of the type shown in FIG. 11 is manufactured by first forming the substrate 1101 (e.g. TFT substrate) using a suitable process (such processes are known in the art and are therefore not discussed in detail here). Then, the planarized layer 1102 is formed on the substrate 1101 using a planarizing process. Then, the anode 121 is formed on the planarized layer 1102. This is done using a CVD (chemical vapor deposition) film forming process, for example.

The insulating layer 1103 is then formed on the planarized layer 1102 and anode 121. This is carried out using a further planarizing process, for example. Portions of the insulating layer 1103 and/or planarized layer 1102 are then removed in order to expose the anode 121 and form the groove 1106. This is carried out by, for example, repeatedly forming a photoresist layer on the insulating layer 1103 and/or planarized layer 1102, exposing a portion of the photoresist layer to a predetermined pattern of light, carrying out a developing process to remove the exposed portion of the photoresist layer and etching a portion of the insulating layer 1103 and/or planarized layer 1102 exposed by the removed portion of the photoresist layer. This process is repeated to etch away successive layers of the insulating layer 1103 and/or planarized layer 1102 until the anode 121 is exposed and the groove 1106 is formed.

The organic and cathode layers 1104 and 1105 are then deposited over the exposed anode 121, the remaining portions of the insulating layer 1103 and the inside surface of the groove 1106 (again using a CVD film forming process, for example). Alternatively, the organic layer 1104 may be deposited on the anode 121 only (that is, not over the remaining portions of the insulating layer 1103 and the inside surface of the groove 1106) whilst the cathode layer 1105 is deposited over the exposed anode 121, the remaining portions of the insulating layer 1103 and the inside surface of the groove 1106.

(Eighth Example of Structure of Pixel)

Figure 12:
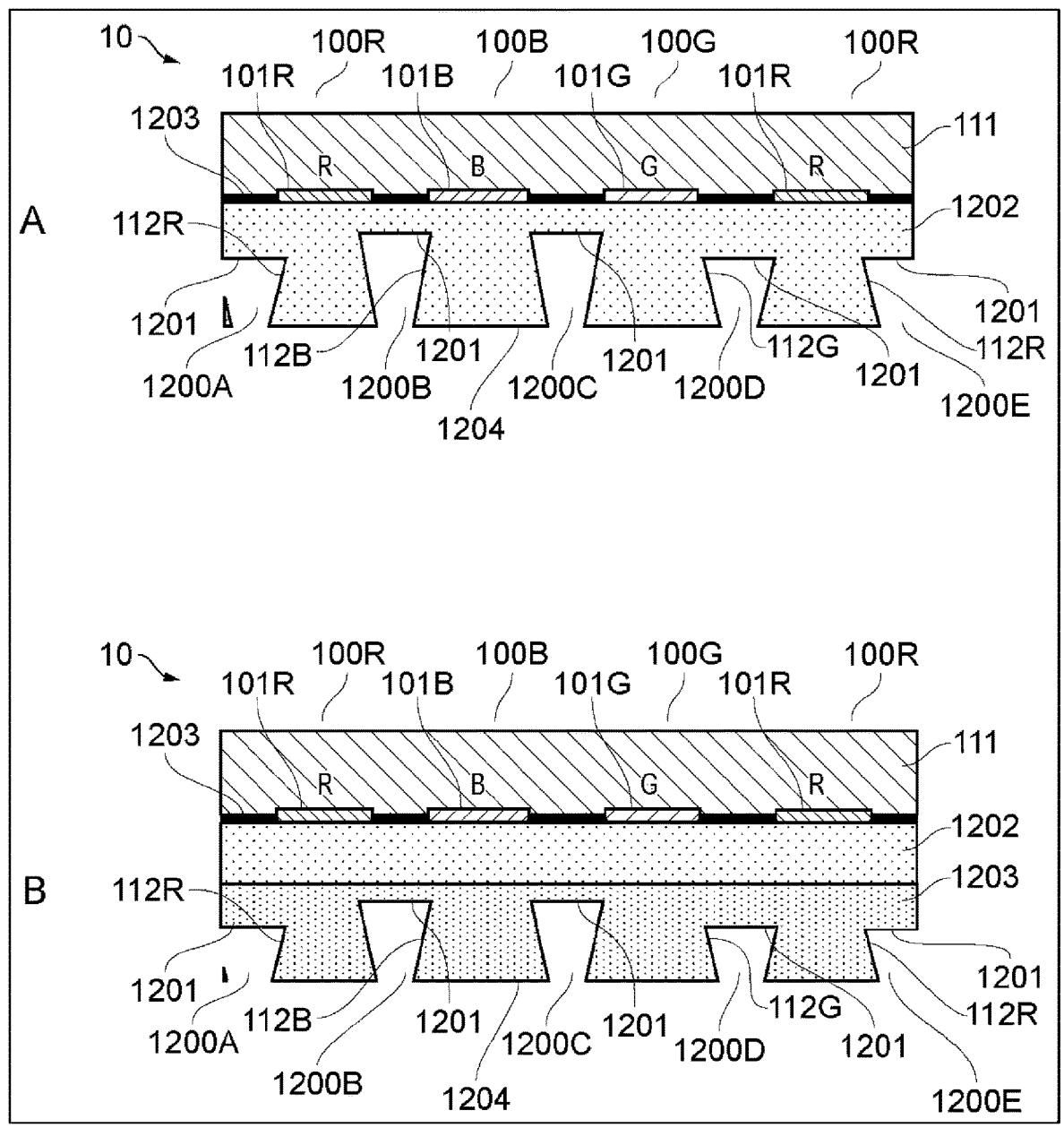
FIGS. 12A and 12B each show a main part cross-sectional view illustrating a part of a structure of a pixel according to variants of an eighth embodiment.

FIGS. 12A and 12B each show a main part cross-sectional view illustrating a part of a structure of a bottom emission pixel according to variants of an eighth embodiment. A structure of a pixel 10 according to the eighth embodiment will be described below with reference to these main part cross-sectional views.

The pixels 10 of FIGS. 12A and 12B are each the same as that of FIG. 10A except that, rather than having a first member comprising an upper portion 111B comprising the light emitting elements 101R, 101B and 101G of each sub pixel 100R, 100B and 100G and a lower portion 111A comprising a reflector 112R, 112B and 112G of each sub pixel 100R, 100B and 100G, there is a one piece first member 111 and the reflectors 112R, 112B and 112G are the boundaries of notch portions 1200 at which light emitted by each of the light emitting elements 101 is reflected by internal reflection (e.g. total internal reflection). The notch portions 1200 provide gaps (e.g. air or vacuum gaps) with a lower refractive index than that of the material (a resin such as an acrylic resin, a polyimide resin, a silicon resin or the like) within which the notch portions are formed, thereby providing the boundaries at which light emitted by the light emitting elements is reflected.

The notch portions 1200 of FIGS. 12A and 12B are positioned with respect to the first member 111 similarly to the way in which the portions of material forming the lower portion 111A forming the reflectors 112 of FIG. 10A are positioned with respect to the upper portion 111B. That is, an upper surface 1201 of each notch portion is separated from the first member 111 by a varying distance. In the example of FIG. 12A, the distance between the respective upper surfaces 1201 of notch portions 1200B and 1200C comprising the reflector of one of the sub pixels (reflector 112B of sub pixel 100B, in this example) and the first member 111 is smaller than the distance between the respective upper surfaces 1201 of the remaining notch portions 1200A, 1200D and 1200E comprising at least part of each of the reflectors of the other sub pixels (reflectors 112R and 112G of sub pixels 100R and 100G in this example) and the first member 111.

In the example of FIG. 12A, the surface 1203 of the first member 111 facing the notch portions comprises a planarized layer 1202 in which the notch portions 1200 are formed. The planarized layer 1202 is formed of a transmissive material through which light emitted by each of the light emitting elements 101R, 101B and 101G can pass. The planarized layer 1202 may be formed of, for example, a resin such as an acrylic resin, a polyimide resin, a silicon resin or the like. In the example of FIG. 12B, rather than the notch portions being formed in the planarized layer 1202, a separate notched layer 1203 (formed of a further resin, for example) is provided on the planarized layer 1203 and it is the separate notched layer into which the notch portions 1200 are formed.

In the examples of FIGS. 12A and 12B, due to there being a greater distance between the notch portions 1200A, 1200D and 1200E and the first member 111 and a smaller distance between the notch portions 1200B and 1200C and the first member 111 (and given that each notch portion extends to a bottom surface 1204 of the planarized layer 1202 or notched layer 1203), the surface area of the reflector 112B of sub pixel 100B is greater than the surface area of reflectors 112R and 112G of sub pixels 100R and 100G.

In the pixel 10 of FIGS. 12A and 12B, the luminance of a specific sub pixel 100 is increased because of the differing surface area of the reflector 112 of the specific sub pixel 100 among the four sub pixels 100. For example, when the surface area of the reflector 112B of the sub pixel 100B is higher than that of the other sub pixels (as shown in FIGS. 12A and 12B), a region in which light from the organic light emitting element 101B undergoes total reflection increases, and thus the luminance of the sub pixel 100B relative to that of the other sub pixels is improved. Further, in the pixel 10 of FIGS. 12A and 12B, since the inclined surface area of the reflector 112 is changed without changing the light emitting area or the pitch arrangement of each sub pixel 100, it is possible to easily achieve high definition.

As described above, in the pixel 10 of FIGS. 12A and 12B, the surface area of the reflector 112 with respect to the organic light emitting element 101 serving as the light emitting portion is determined for each sub pixel 100 so that only the surface area of the reflector 112 of the specific sub pixel 100 is different from the inclined surface areas of the reflectors 112 of the other sub pixels 100. Accordingly, in the pixel 10 of FIGS. 12A and 12B, it is possible not only to improve the light extraction efficiency by the light reflecting layer but also to improve the luminance of the specific sub pixel 100 by causing that sub pixel 100 to have a different luminance. In the case of increasing the luminance of sub pixel 100B using a reflector 112B with a higher surface area relative to that of the other sub pixels 100R and 100G, each of the sub pixels 100 can achieve the same (or similar) lifespan deterioration.

Further, in FIGS. 12A and 12B, the example in which the surface area of the reflector 112B is higher than that of the other reflectors and in which the surface areas of the other reflectors (that is, the reflector 112G and the reflector 112R) are equal has been described. However, this is only an example, and the reflector 112 whose surface area is changed (by determining the size of the gap between the notch portion whose boundary defines that reflector 112 and the first member 111) is arbitrary as long as the surface area of the reflector 112 of the specific sub pixel 100 is different from the inclined surface areas of the other sub pixels 100.

Further, an example in which the surface area of the reflector 112 of one sub pixel 100 as the specific sub pixel 100 is changed has been described, but the number of specific sub pixels 100 may be two or more. That is, more generally, the distance between the upper surface 1201 of each notch portion and the first member 111 may be varied such that the surface area of the reflector of a portion of the sub pixels 100 of a pixel 10 is greater than that of the reflector of a remaining portion of the sub pixels 100 of the pixel 10. This improves the luminance of the specific sub pixels 100 to which a reflector 112 with a greater surface area is provided. It will also be appreciated that, more generally, each reflector 112 (or, at least, each of a portion of the reflectors 112) may have a different respective inclined surface area (e.g. by adjusting the distance between the upper surface 1201 of each notch portion and the first member 111). Alternatively, each reflector may have the same inclined surface area (e.g. by ensuring that the distance between the upper surface 1201 of each of the notch portions 1200 and the first member 111 is the same), thereby providing an equally improved luminance of each of the sub pixels 100 and thus an improved overall luminance of the pixel 10.

It will furthermore be appreciated that the notch portions 1200 of FIGS. 12A and 12B may a similar arrangement to that of FIG. 10A instead of FIG. 10B. Namely, the distance between the upper surface 1201 of each of the notch portions 1200 and the first member 111 may be the same and a portion of the notch portions 1200 (e.g. the notch portions 1200B and 1200C comprising the reflector 112B of sub pixel 100B) may extend in a direction towards the bottom surface 1204 of the planarized layer 1202 or notched layer 1203 to a greater extent (providing a greater reflector depth) than the extent to which a remaining portion of the notch portions 1200 (e.g. the remaining notch portions 1200A, 1200D and 1200E) extend towards the bottom surface 1204 of the planarized layer 1202 or notched layer 1203 (providing a less reflector depth).

Although the pixels 10 of FIGS. 12A and 12B use colored light emitting elements 101R, 101B and 101G, it will be appreciated that, alternatively, white light emitting elements 101R, 101B and 101G could be used. In this case, the pixel 10 comprises a further layer attached to the bottom surface 1204 of the planarized layer 1202 or notched layer 1203 comprising appropriate color filters (like those shown in FIGS. 5, 6, 7 and 8A and 8B, for example). In such a layer, a red color filter (e.g. color filter 101R) is aligned with the light emitting elements 101R, a blue color filter (e.g. color filter 131B) is aligned with the light emitting element 101B and a green color filter (e.g. color filter 131G) is aligned with light emitting element 101G.

In the above-mentioned embodiments, each reflector 112 comprises a light reflecting surface (e.g. a reflective surface of first member 111 or a boundary between a material with a higher refractive index and a material with a lower refractive index) with an area which may be different for one or more of the sub pixels 100 of each pixel 10 in order to change amount of reflected light for those sub pixels 100 and thus the output luminance of those sub pixels 100.

In the above-mentioned embodiments, the light reflecting surface of each sub pixel 100 is an inclined surface and the area of the inclined surface of each sub pixel 100 is determined according to a length along which that inclined surface extends in a stacking direction (with the greater the length of the inclined surface, the greater the area over which light is reflected and the greater the amount of light which is reflected).

In some embodiments (e.g. those of FIGS. 5, 6, 8A, 9A, 9B and 10B), the inclined surfaces of all reflectors 112 extend from a common plane and the length along which each inclined surface extends is determined by the height or depth of that inclined surface. In the examples of FIGS. 5, 6, 8A, 9A and 9B, the common plane is the plane along which each of the light emitting elements 101 is defined. In the example of FIG. 10B, the common plane is the top surface of the lower portion 111A of the first member 111 (which is parallel to the plane along which the light emitting elements 101 are defined and separated from the plane along which the light emitting elements 101 are defined by the gap 1003).

In other embodiments (e.g. those of FIGS. 7, 8B, 9C, 10A, 12A and 12B), at least one inclined surface extends from a plane at a different position in the stacking direction to the plane(s) at which each of the other inclined surface(s) extends. Each inclined surface may, however, extend such that all inclined surfaces meet in a common plane. In the examples of FIGS. 7, 8B, 9C, 10A, 12A and 12B, the inclined surface of reflector 112B extends from a different plane to that of the inclined surfaces of the other reflectors. However, all the inclined surfaces extend to meet in a common plane. In FIG. 7, the common plane is that defined by the top of the first member 11 (on which the color filters 131 are arranged). In FIGS. 8B and 9C, the common plane is that defined by the top of the upper portion 111B of the first member 111. In FIG. 10A, the common plane is that defined by the bottom of the lower portion 111A of the first member 111. In FIGS. 12A and 12B, the common plane is that defined by the bottom of the planarized layers 1202 and 1203, respectively. The length along which each inclined surface extends is therefore varied by the position of the plane from which that inclined surface extends to the common plane.

In all of the above-mentioned embodiments, the length along which an inclined surface of each sub pixel 100 extends in the stacking direction (thereby defining the area of the inclined surface which reflects light) may be referred to as the height or depth of that inclined surface relative to the light emitting portion of that sub pixel 100. It will be appreciated that "height" and "depth" are relative terms in that something measured as a "height" may equally be measured as a "depth" if the length concerned is considered from a different perspective (e.g. if FIG. 5 is viewed upside down, then the "height" of each reflector 112 becomes a "depth" and if FIG. 10A or 10B is viewed upside down, then the "depth" of each reflector 112 becomes a "height"). The terms "height" and "depth" should therefore be considered functionally equivalent and the terms "height" or "depth" may be used interchangeably with the expression "length which extends in a stacking direction". The length along which each reflector 112 extends in the stacking direction may also be referred to, more generally, as the distance between a first plane which is coplanar with a first end of the reflector 112 (e.g. the top of the reflector in the stacking direction) and a second plane which is coplanar with a second end of the reflector 112 (e.g. the bottom of the reflector in the stacking direction).

In embodiments, the term "stacking direction" should be understood to mean the direction in which the display element 1 comprising the pixels 10 and sub pixels 100 is formed by successively stacking one layer on top of another. The layers include, for example, the first member 111 (including, where present, the lower portion 111A and upper portion 111B of the first member 111), the anode, organic layer and cathode of each light emitting element 101 and, where present, one or more planarized layers (such as planarized layers 907, 1000, 1106, 1202 and 1203).

It will be appreciated that the present technique may be applied more generally such that a plurality of pixels (each of which may comprise a plurality of sub pixels or may itself be a sub pixel) arranged in a two-dimensional form include a first pixel, a second pixel and a third pixel. A first light reflecting portion (reflector 112) is located between the first pixel and the second pixel (so as to reflect light emitted by either the first or second pixel) and a second light reflecting portion (reflector 112) is located between the second pixel and the third pixel (so as to reflect light emitted by either the second or third pixel). The height of the first and second light reflecting portions may be the same (in order to improve the perceived luminance of each pixel from which light is reflected equally). Alternatively, the height of the first and second light reflecting portions may be different (in order to improve the perceived luminance of one pixel from which light is reflected over another).

In the above-mentioned embodiments, it will be appreciated that each reflector 112 is an inclined reflective surface and that each pixel (which may comprise a plurality of sub pixels or may itself be a sub pixel) emits light which is reflected by one or more of these surfaces. For example, in each of FIGS. 5, 6, 7, 8A, 8B, 9A, 9C, 10A, 10B, 12A and 12B, each of the sub pixels 100 emits light which is reflected by two inclined surfaces (that is, each sub pixel is said to have two inclined surfaces). In FIG. 9B, the blue sub pixel 100B emits light which is reflected by two inclined surfaces (that is, the blue sub pixel 100B has two inclined surfaces), each of one of the red sub pixels 100R and the green sub pixel 100G emits light which is reflected by one inclined surface (that is, each of these sub pixels has one inclined surface) and the remaining red sub pixel 100R emits light which is not reflected by an inclined surface (that is, this sub pixel has no inclined surface). It will be appreciated that, in the above-mentioned embodiments, a different perceived luminance of a first pixel relative to a second pixel is achieved by changing the height of at least one inclined reflective surface of the first pixel with respect to the height of at least one inclined reflective surface of the second pixel so as to change the overall area over which light emitted by the first pixel is reflected with respect to the overall area over which light emitted by the second pixel is reflected.

(Details of Structure of Reflector)

Next, a structure of the reflector 112 will be described in detail with reference to FIGS. 13 to 17.

Figure 13:
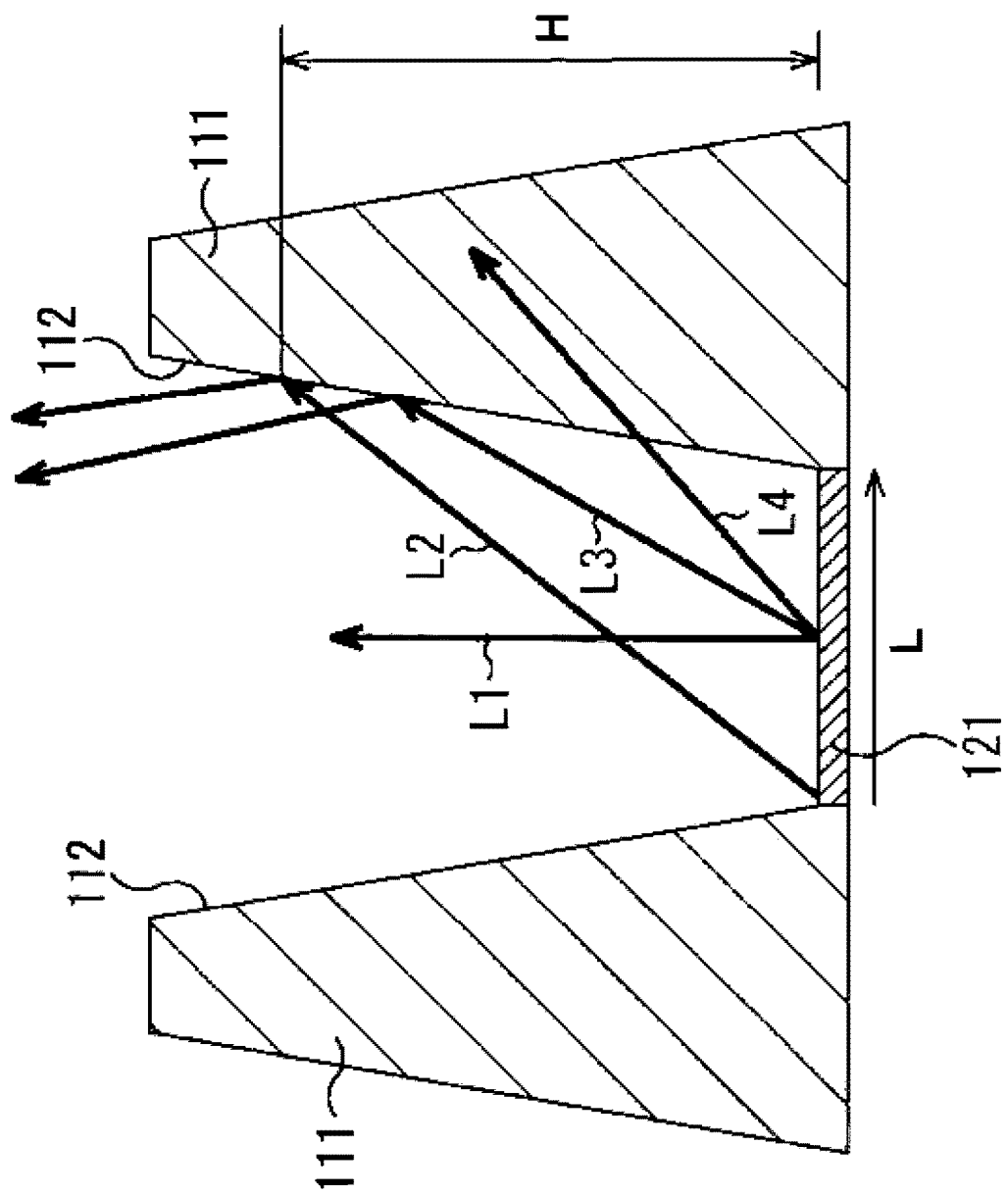
FIG. 13 is a conceptual diagram for describing reflection of light by a reflector.

FIG. 13 is a conceptual diagram for describing reflection of light by the reflector 112.

As illustrated in FIG. 13, in the sub pixel 100, the light from (the anode electrode 121 of) the organic light emitting element 101 to the reflector 112 is omnidirectional, but the reflector 112 reflects light incident at a predetermined total reflection angle or more but transmits light incident at less than the angle.

For example, in FIG. 13, the light beams L2 and L3 among light beams L1 to L4 from the anode electrode 121 of the organic light emitting element 101 are totally reflected by the reflector 112, while the light beam L4 passes through the reflector 112.

Figure 14:
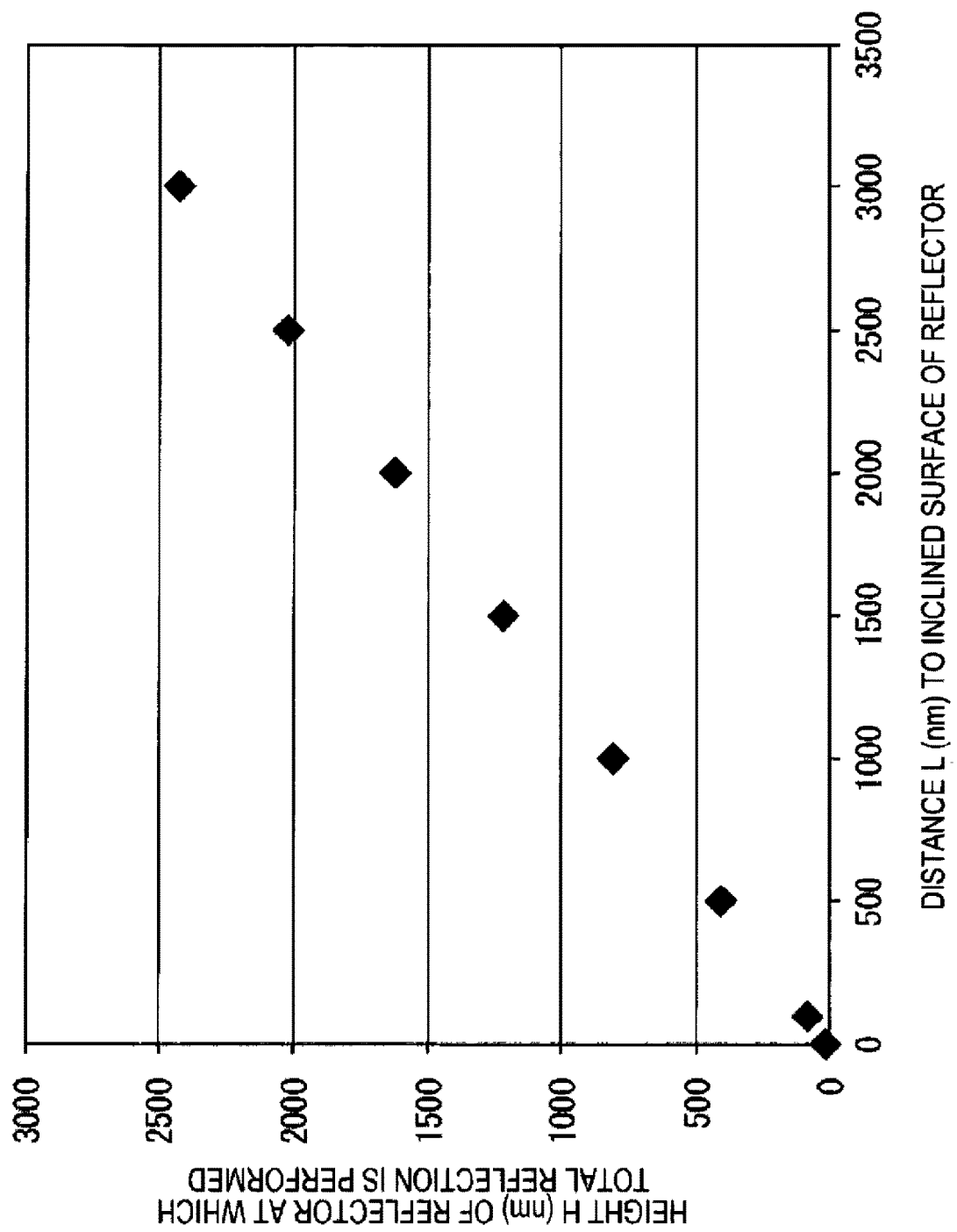
FIG. 14 is a diagram illustrating a relation between a distance to an inclined surface of a reflector and a height of the reflector at which total reflection is performed.

Here, FIG. 14 illustrates a relation between a distance L (unit: nm) to the inclined surface of the reflector 112 and an inclined surface height H (unit: nm) of the reflector 112 at which the total reflection is performed.

For example, in a case in which a width of the opening portion (the portion in which the anode electrode 121 is exposed) between the reflectors 112 is 2,000 nm, the distance L to the inclined surface of the reflector 112 is a maximum of 2,000 nm. In this case, the height H satisfying the total reflection condition is approximately 1,600 nm from the relation between L and H illustrated in FIG. 14.

In other words, in the reflector 112, a reflection region has the height H=1600 nm or more, and since the total reflection region increases as the height (inclined surface height) H is increased, the luminance of the sub pixel 100 can be improved. In other words, it can be said that the luminance is improved by the increase in the reflection area with the increase in the inclined surface height H.

Here, the height (inclined surface height) H satisfying the total reflection condition can be obtained by, for example, the following calculation.

Figure 15:
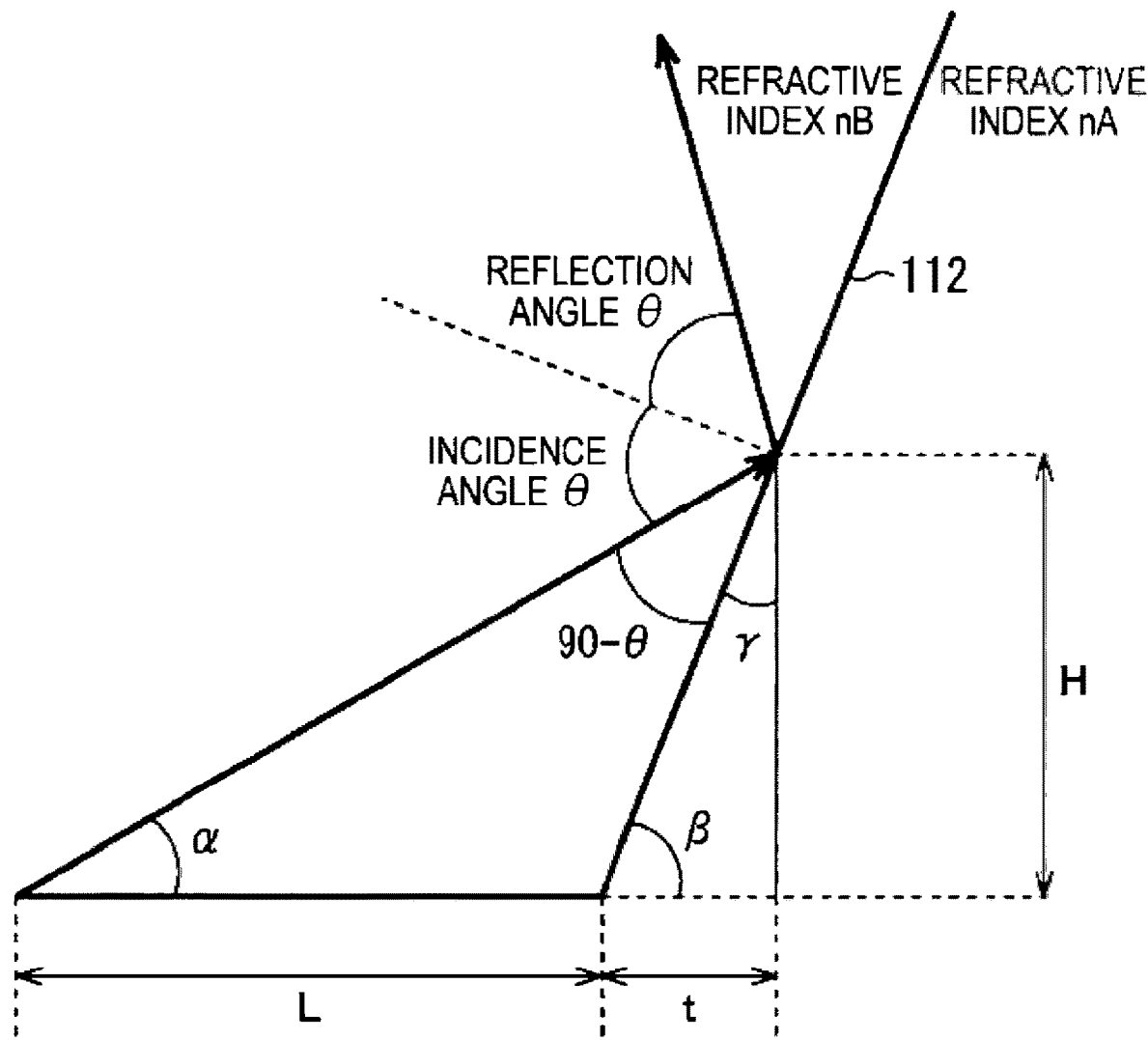
FIG. 15 is a conceptual diagram for describing the reflection of light by a reflector.

In other words, as illustrated in FIG. 15, in a case in which an incidence angle (reflection angle) of light incident on the reflector 112 is indicated by θ, α can be calculated by the following Formula (3).

$$\alpha = \tan^{-1}(H/(L+t)) \tag{3}$$

Here, if the reflector angle (inclination angle) is indicated by β, a relation of the following Formula (4) is obtained by the exterior angle theorem of a triangle.

$$(90-\theta)+\alpha=\beta \tag{4}$$

Therefore, a relation of the following Formula (5) can be derived from Formulas (3) and (4).

$$\theta = 90+\alpha-\beta = 90+\tan^{-1}(H/(L+t))-\beta$$

$$\tan^{-1}(H/(L+t)) = \theta+\beta-90$$

$$\tan(\theta+\beta-90) = H/(L+t) \tag{5}$$

Further, since t=H/tan β is obtained from the relation of tan β=H/t, a relation of the following Formula (6) can be derived on the basis of Formula (5).

$$H=(L+t)\times\tan(\theta+\beta-90)=(L+(H/\tan\beta))\times\tan(\theta+\beta-90) \tag{6}$$

Then, since the total reflection is performed at θ>θ$_{max}$ (a critical angle), the height H satisfying the relation of the following Formula (7) can be obtained.

$$H \geq L \times \tan(\theta_{max}+\beta-90)/(1-(\tan(\theta_{max}+\beta-90)/\tan\beta)) \tag{7}$$

Accordingly, the height (inclined surface height) H satisfying the total reflection condition is obtained.

Here, a case in which a refractive index nA of the reflector 112 (for example, SiO), that is, the refractive index nA of the surface of the first member 111 is 1.4, and a refractive index nB of an organic EL material of the organic layer (for example, a layer 141 of FIG. 22 to be described later) at an interface with the reflector 112 is 1.8 as illustrated in FIG. 15 is assumed. In this case, θ$_{max}$ (critical angle) at which the total reflection is performed has a relation of the following Formula (8).

$$\sin\theta_{max}=\sin\theta_{max}/\sin 90°=nA/nB \tag{8}$$

Then, a calculation result of the following Formula (9) is obtained by calculating Formula (8).

$$\theta_{max}=\sin^{-1}(nA/nB)=\sin^{-1}(1.4/1.8)=\sin^{-1}(0.882)=51.3° \tag{9}$$

Since θ$_{max}$=51.3° is obtained as described above, if it is assumed that L is 1000 nm, and β is 71°, H=808 nm can be obtained by solving the following Formula (10) on the basis of Formula (7).

$$H = L \times \tan(\theta_{max}+\beta-90)/(1-(\tan(\theta_{max}+\beta-90)/\tan\beta))$$

$$= 1000 \times \tan(51.3°+71°-90°)/(1-(\tan(51.3°+71°-90°)/\tan71°))$$

$$= 808.07$$

Further, the inventors of the present technology analyzed the optimum reflector angle β and the width of the opening portion between the reflectors 112 (the size of the opening portion) by obtaining a change in the height (inclined surface height) H satisfying the total reflection condition in a case in which the reflector angle β is changed by a detailed simulation. The result of the simulation is illustrated in FIG. 16.

A table of FIG. 16 illustrates a value (unit: nm) of the height (inclined surface height) satisfying the total reflection condition (unit: degree) when the value (unit: degree) of reflector angle s and the value (unit: nm) of the distance L to the inclined surface of the reflector 112 are changed.

Here, the table of FIG. 16 illustrates the values of the height H obtained by calculating Formula (7) when β=60°, 65°, 68°, 70°, 71°, 73°, 74°, 75°, and 80°, and L=10 nm, 100 nm, 500 nm, 1000 nm, 1500 nm, 2000 nm, 2500 nm, and 3000 nm.

Figure 17:
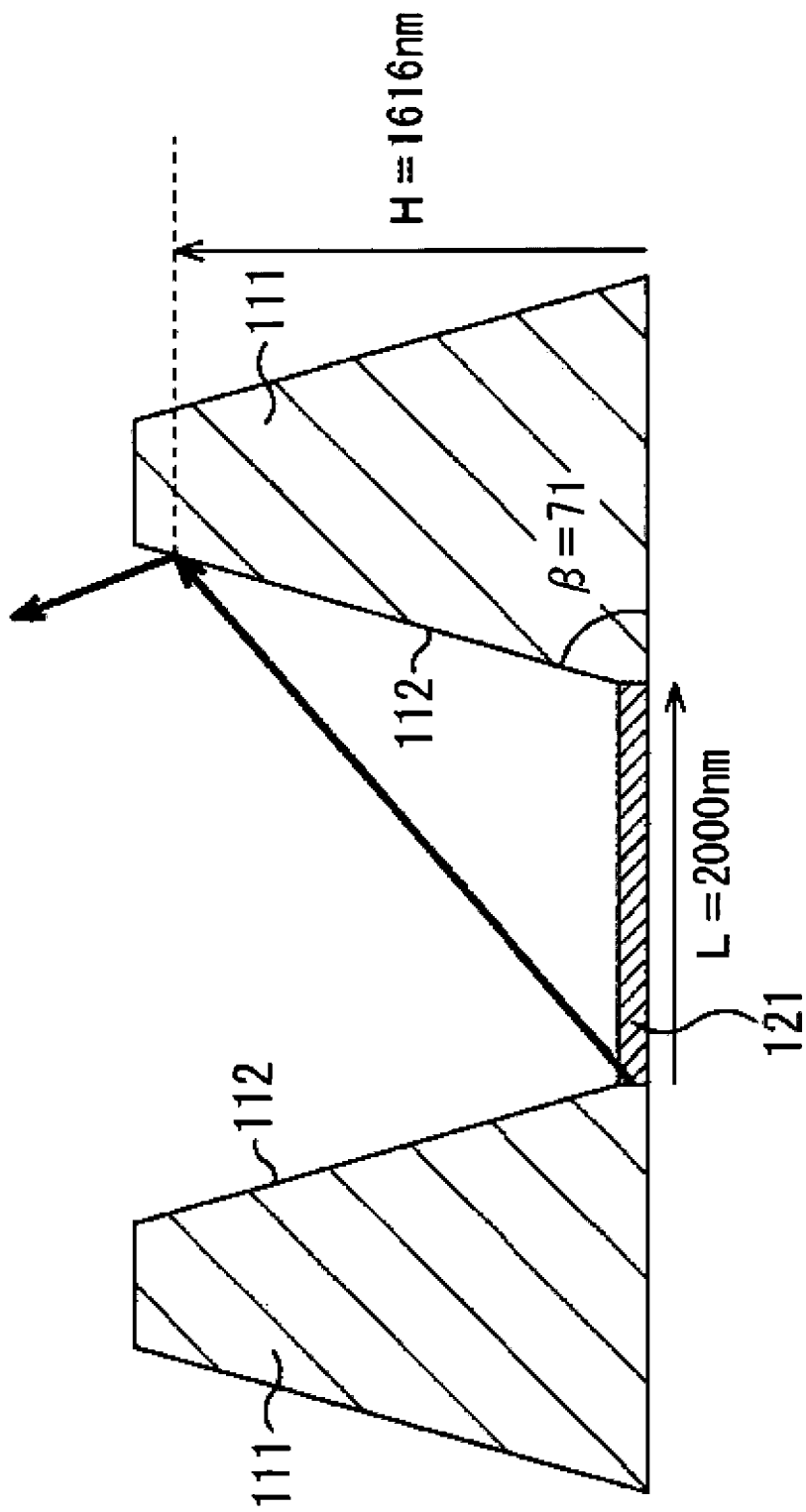
FIG. 17 is a diagram illustrating an example of a structure of a reflector satisfying a predetermined total reflection condition.

Further, it was found from the results of this simulation that it is desirable that the width of the portion in which the organic light emitting element 101 serving as the light emitting portion emits (the portion in which the anode electrode 121 is exposed), that is, the size of the opening portion be 3000 nm or less, and in that case, it is desirable that the reflector angle β is 60 to 80°. An example of a structure satisfying such a total reflection condition is illustrated in FIG. 17. In FIG. 17, when β=71° and L=2000 nm, H=1616 nm.

(First Example of Manufacturing Process)

Next, a flow of a first example of a top emission pixel manufacturing process according to an embodiment of the present technology will be described with reference to FIGS. 18 to 22.

Further, in the first example of the manufacturing process, for the sake of convenience of description, a flow of a process of manufacturing the sub pixels 100R and 100G as arbitrary sub pixels 100 constituting the pixel 10 will be described.

Figure 18:
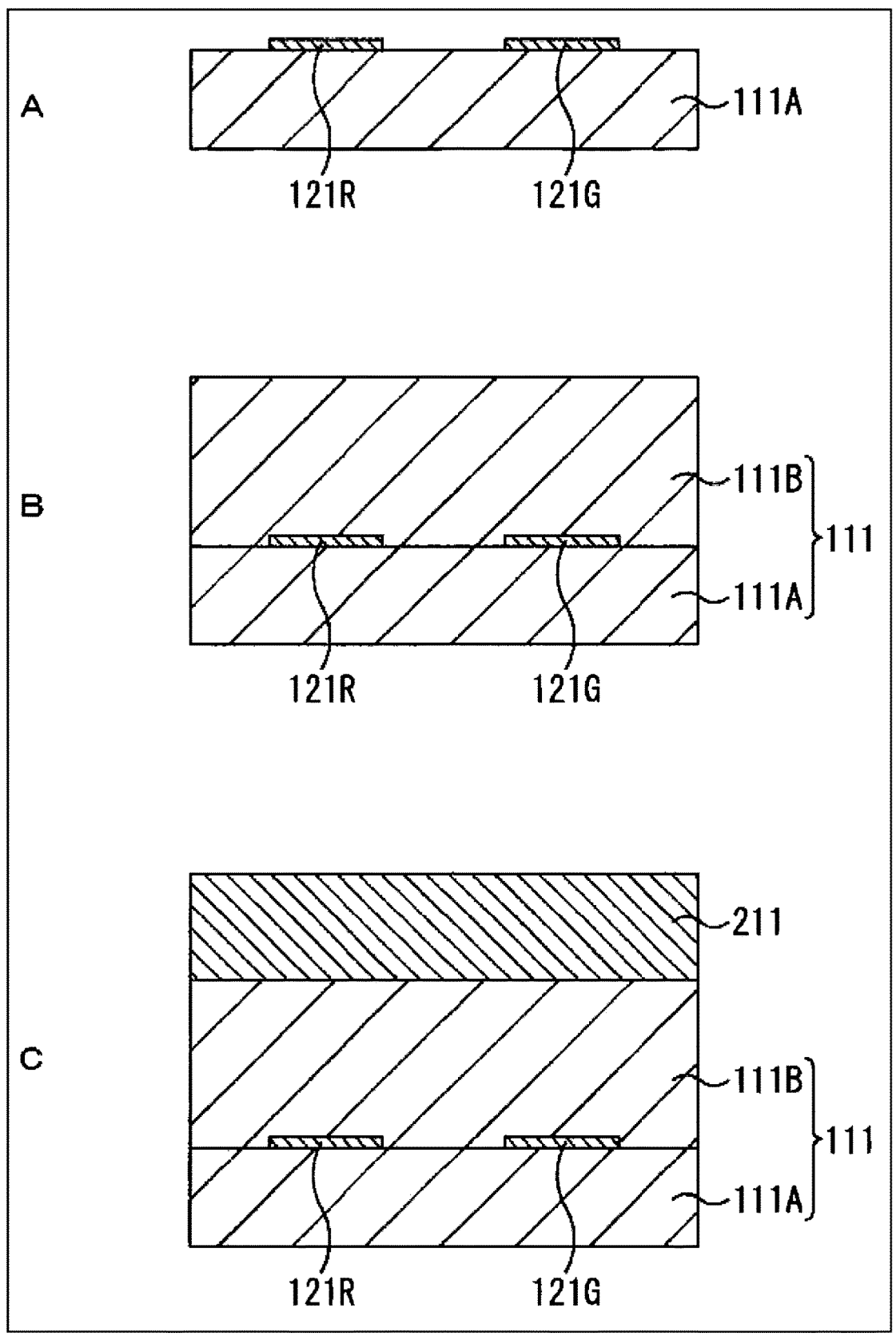
FIG. 18 is a diagram for describing a flow of a first example of a pixel manufacturing process according to an embodiment of the present technology.

Here, first, a dry processing process is performed as illustrated in A of FIG. 18. With the dry processing process, anode electrodes 121R and 121G are formed on a first member 111A. Further, for example, $SiO_2$ or the like can be used as a material of the first member 111A. Further, a reflective material such as Al, Cu or the like can be used as the material of the anode electrode 121.

Next, a CVD film forming process is performed as illustrated in B of FIG. 18. With the CVD film forming process, a first member 111B is formed on the anode electrodes 121R and 121G formed on the first member 111A. Further, for example, P—SiO or the like can be used as a material of the first member 111B.

Next, a resist coating process is performed as illustrated in C of FIG. 18. With the resist coating process, the first member 111B is coated with a photoresist 211.

Figure 19:
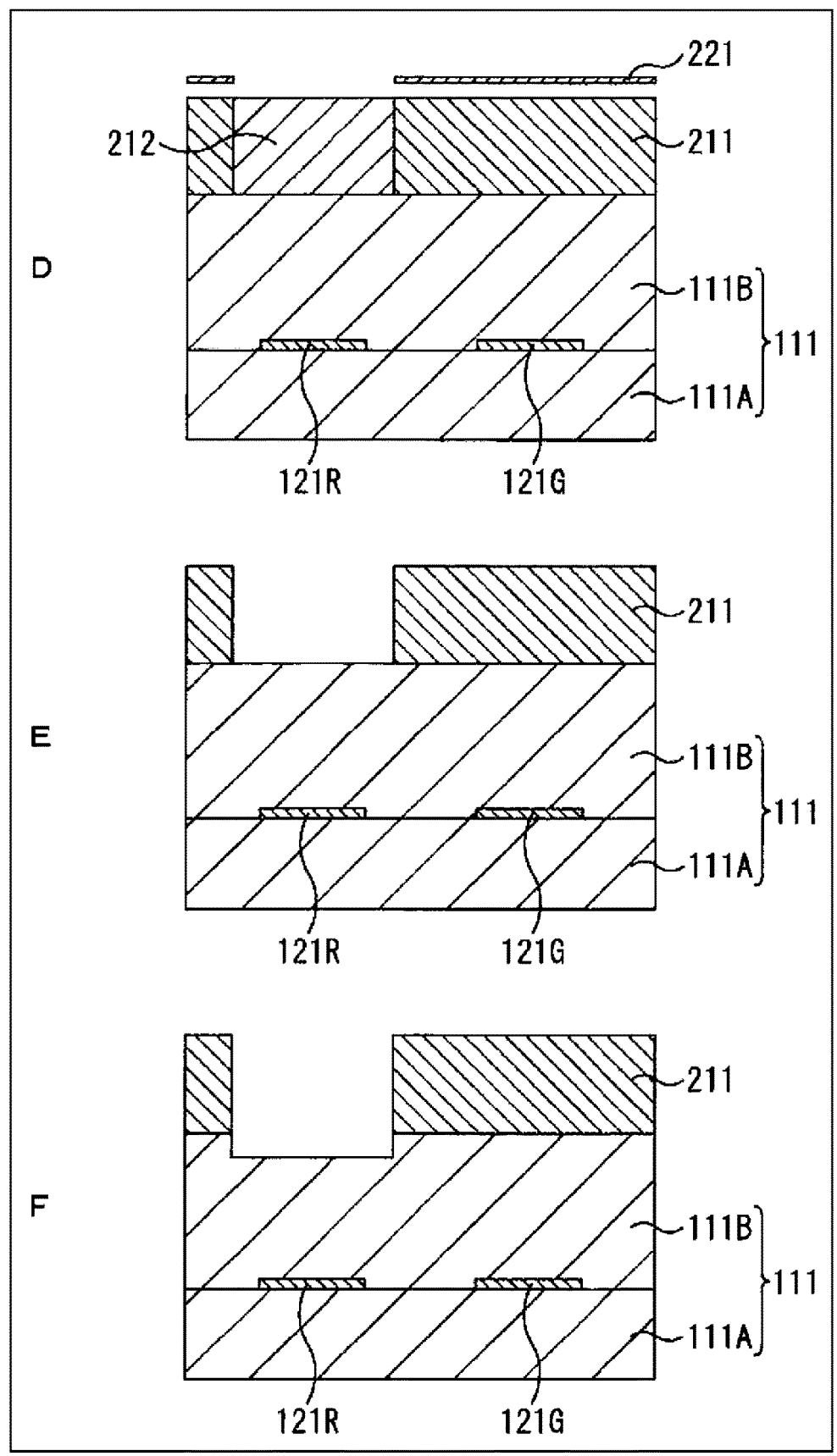
FIG. 19 is a diagram for describing a flow of a first example of a pixel manufacturing process according to an embodiment of the present technology.

Then, an exposure process is performed as illustrated in D of FIG. 19. With the exposure process, a surface of the photoresist 211 is exposed to light in a pattern form using a photomask 221, so that a pattern including the exposed portion (an exposed portion 212) and an unexposed portion (a portion excluding the exposed portion 212) is formed.

Then, a developing process is performed as illustrated in E of FIG. 19. With the developing process, the exposed portion 212 of the photoresist 211 is removed.

Then, an etching process is performed as illustrated in F of FIG. 19. With the etching process, the portion excluding the portion masked by the photoresist 211 is etched, and a part of the first member 111B is processed.

Figure 20:
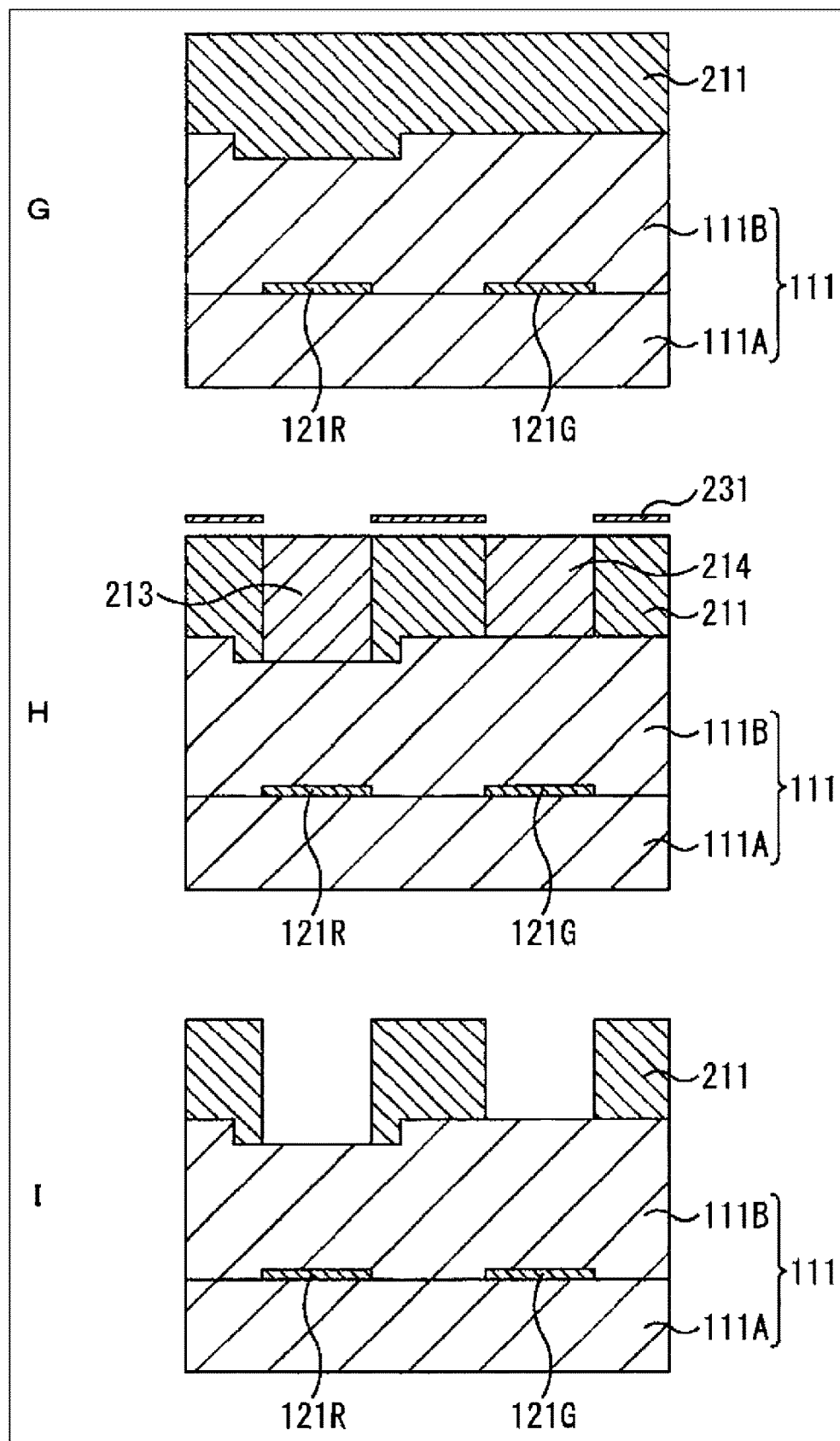
FIG. 20 is a diagram for describing a flow of a first example of a pixel manufacturing process according to an embodiment of the present technology.

Then, a resist coating process is performed as illustrated in G of FIG. 20. With the resist applying process, the processed portion of the first member 111B is coated with the photoresist 211.

Next, an exposure process is performed as illustrated in H of FIG. 20. With the exposure process, a surface of the photoresist 211 is exposed to light in a pattern form using a photomask 231, so that a pattern including the exposed portions (exposed portions 213 and 214) and an unexposed portion (a portion excluding the exposed portions 213 and 214) is formed.

Then, a developing process is performed as illustrated in I of FIG. 20. With the developing process, the exposed portions 213 and 214 of the photoresist 211 are removed.

Figure 21:
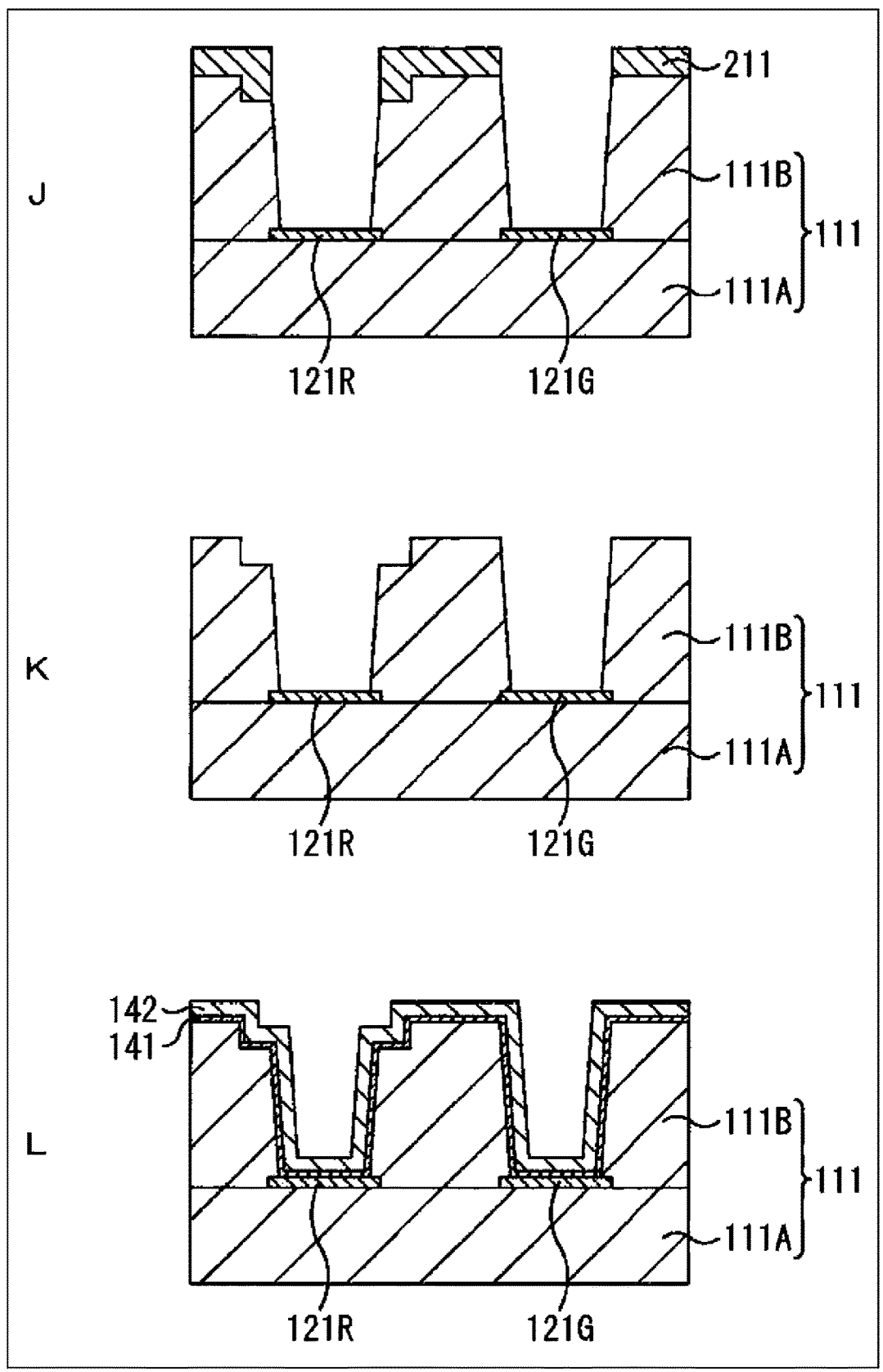
FIG. 21 is a diagram for describing a flow of a first example of a pixel manufacturing process according to an embodiment of the present technology.

Then, an etching process is performed as illustrated in J of FIG. 21. With the etching process, the portion excluding the portion masked by the photoresist 211 is etched, and a part of the first member 111B is processed. With the process, the reflectors having different heights in the respective sub pixels 100 are formed, and the anode electrodes 121R and 121G on the first member 111A are exposed.

Then, a resist peeling process is performed as illustrated in K of FIG. 21. With the resist peeling process, the photoresist 211 is peeled off.

Then, a vapor deposition process and a CVD film forming process are performed as illustrated in L of FIG. 21. With the vapor deposition process, a layer 141 including an organic layer and a cathode electrode layer (formed of a transparent material such as ITO, for example) and a protective film 142 are formed on the surface of the anode electrodes 121R and 121G and the first member 111B formed on the first member 111A. Further, the organic layer emits light between the anode electrode and the cathode electrode layer. For example, it is desirable that the organic layer emit white light. Further, for example, an insulating material, a conductive material, or the like can be used as a material of the protective film 142.

Figure 22:
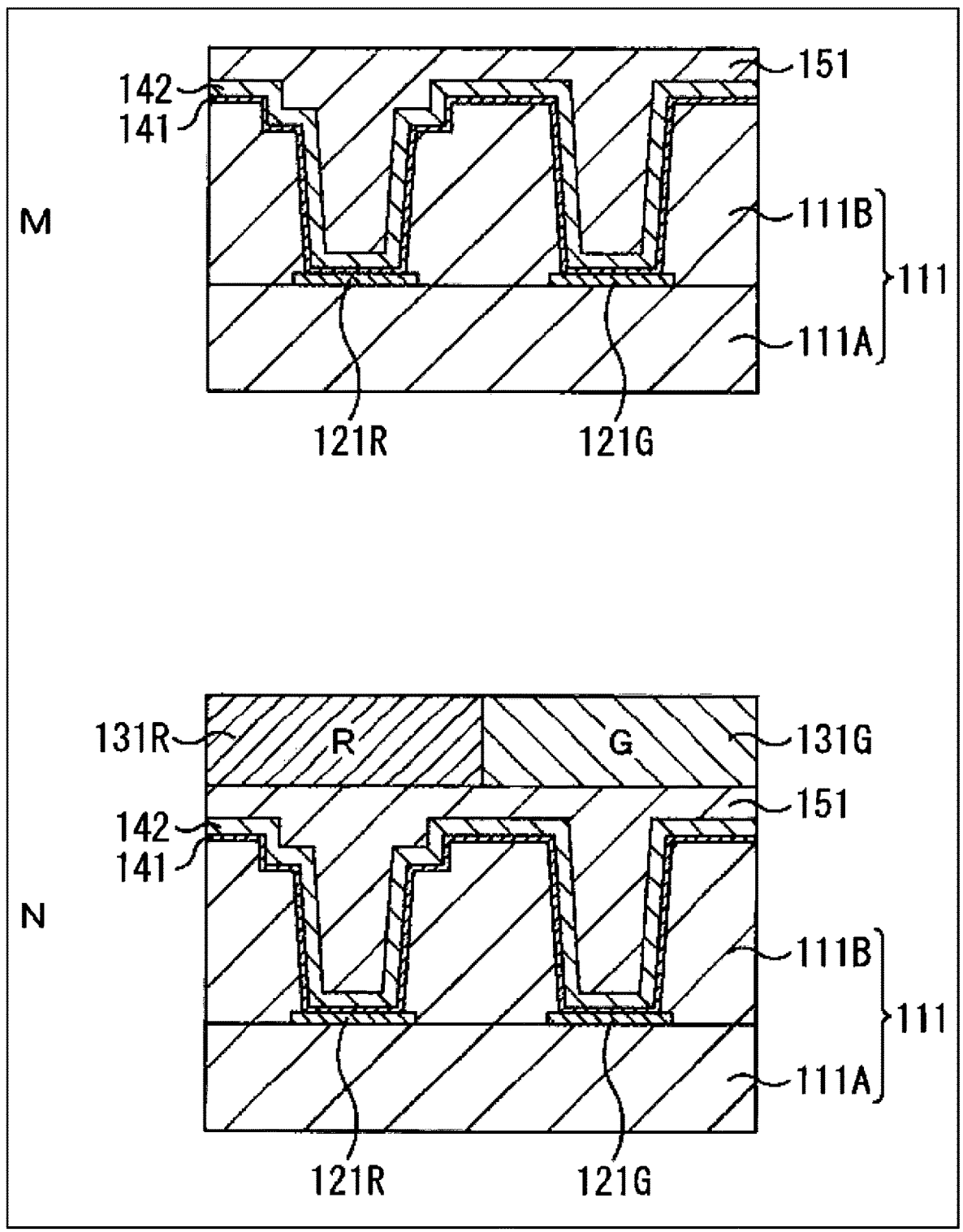
FIG. 22 is a diagram for describing a flow of a first example of a pixel manufacturing process according to an embodiment of the present technology.

Then, a planarizing process is performed as illustrated in M of FIG. 22. With the planarizing process, a second member 151 is embedded and planarized. Further, for example, a resin such as an acrylic resin, a polyimide resin, a silicon resin, or the like can be used as a material of the second member 151.

As described above, after the layer 141 including the organic layer and the cathode electrode layer and the protective film 142 are formed, the second member 151 is further formed, so that the light reflecting layer (reflector structure) including the first member 111 (111B) and the second member 151 is formed.

Then, a color filter forming process is performed as illustrated in N of FIG. 22. With the color filter forming process, color filters 131R and 131G are formed on the planarized second member 151.

In the pixel 10 manufactured as described above, since the inclined surface height of the reflector caused by the inclination of the inclined surface of the first member 111 is different for each sub pixel 100, the respective sub pixels 100 differ in luminance, and thus it is possible to improve the luminance of the specific sub pixel 100.

The first example of the manufacturing process has been described above.

(Second Example of Manufacturing Process)

Next, a flow of a second example of a top emission pixel manufacturing process according to an embodiment of the present technology will be described with reference to FIGS. 23 to 27.

Further, in the second example of the manufacturing process, for the sake of convenience of description, a flow of a process of manufacturing the sub pixels 100R, 100G, 100W, and 100B as arbitrary sub pixels 100 constituting the pixel 10 will be described.

Figure 23:
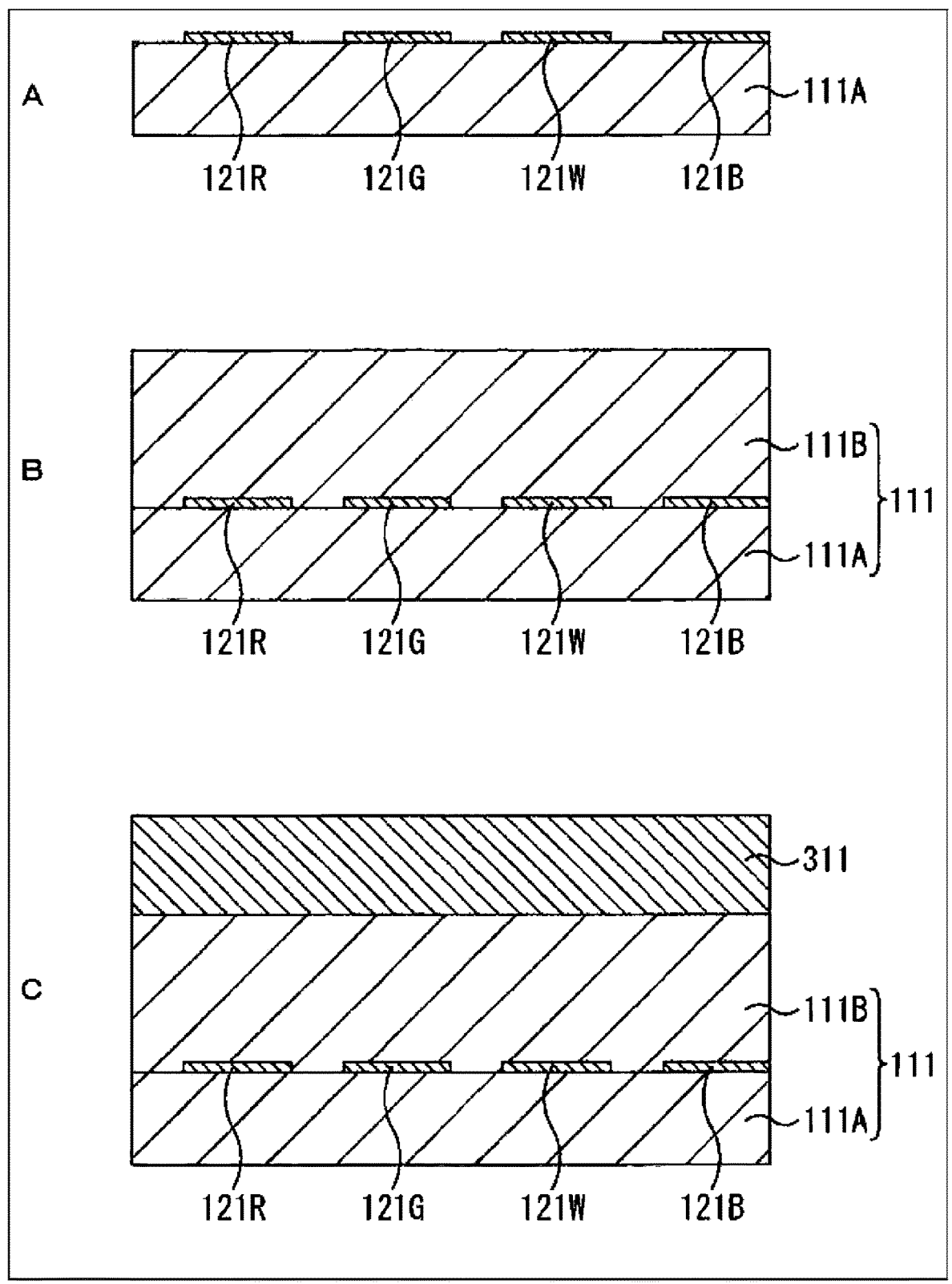
FIG. 23 is a diagram for describing a flow of a second example of a pixel manufacturing process according to an embodiment of the present technology.

Here, first, a dry processing process is performed as illustrated in A of FIG. 23. With the dry processing process, anode electrodes 121R, 121G, 121W, and 121B are formed on a first member 111A. Further, for example, $SiO_2$ or the like can be used as a material of the first member 111A. Further, a reflective material such as Al, Cu or the like can be used as the material of the anode electrode 121.

Next, a CVD film forming process is performed as illustrated in B of FIG. 23. With the CVD film forming process, a first member 111B is formed on the anode electrodes 121R, 121G, 121W, and 121B formed on the first member 111A. Further, for example, P—SiO or the like can be used as a material of the first member 111B.

Next, a resist coating process is performed as illustrated in C of FIG. 23. With the resist coating process, the first member 111B is coated with a photoresist 311.

Figure 24:
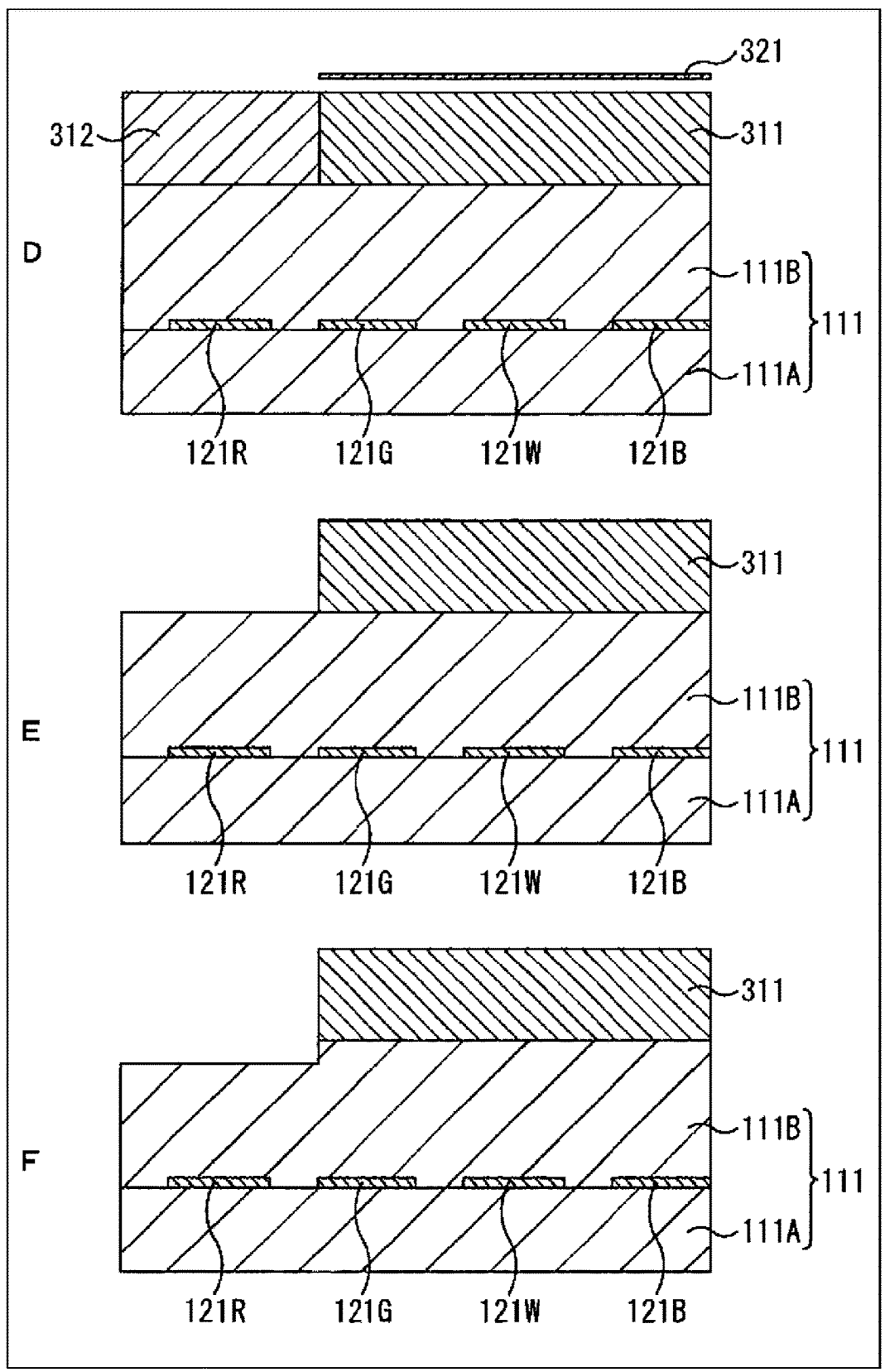
FIG. 24 is a diagram for describing a flow of a second example of a pixel manufacturing process according to an embodiment of the present technology.

Then, an exposure process is performed as illustrated in D of FIG. 24. With the exposure process, a surface of the photoresist 311 is exposed to light in a pattern form using a photomask 321, so that a pattern including the exposed portion (an exposed portion 312) and an unexposed portion (a portion excluding the exposed portion 312) is formed.

Then, a developing process is performed as illustrated in E of FIG. 24. With the developing process, the exposed portion 312 of the photoresist 311 is removed.

Then, an etching process is performed as illustrated in F of FIG. 24. With the etching process, the portion excluding the portion masked by the photoresist 311 is etched, and a part of the first member 111B is processed.

Figure 25:
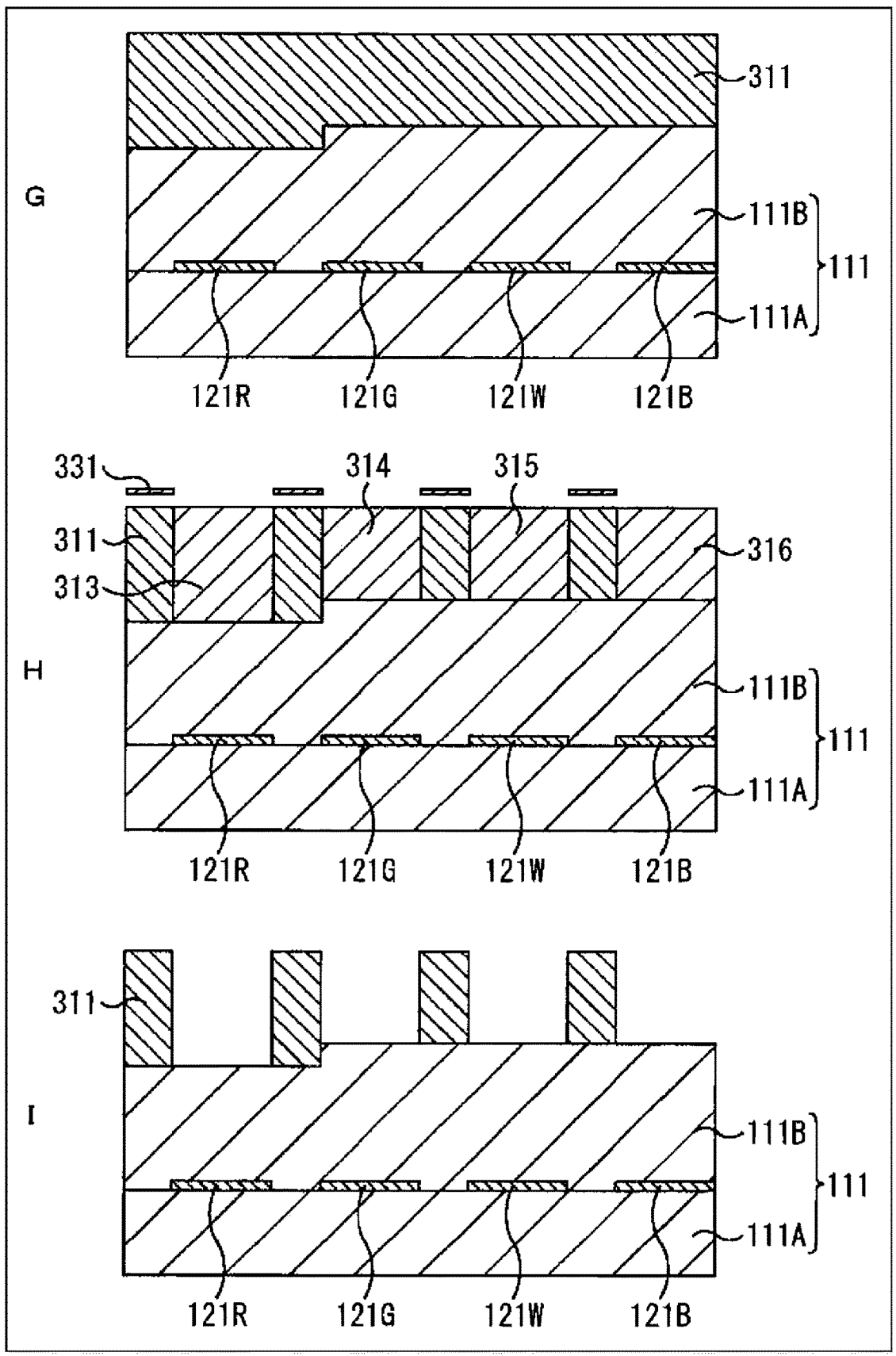
FIG. 25 is a diagram for describing a flow of a second example of a pixel manufacturing process according to an embodiment of the present technology.

Then, a resist coating process is performed as illustrated in G of FIG. 25. With the resist applying process, the processed portion of the first member 111B is coated with the photoresist 311.

Next, an exposure process is performed as illustrated in H of FIG. 25. With the exposure process, a surface of the photoresist 311 is exposed to light in a pattern form using a photomask 331, so that a pattern including the exposed portions (exposed portions 313, 314, 315, and 316) and an unexposed portion (a portion excluding the exposed portions 313, 314, 315, and 316) is formed.

Then, a developing process is performed as illustrated in I of FIG. 25. With the developing process, the exposed portions 313, 314, 315, and 316 of the photoresist 311 are removed.

Figure 26:
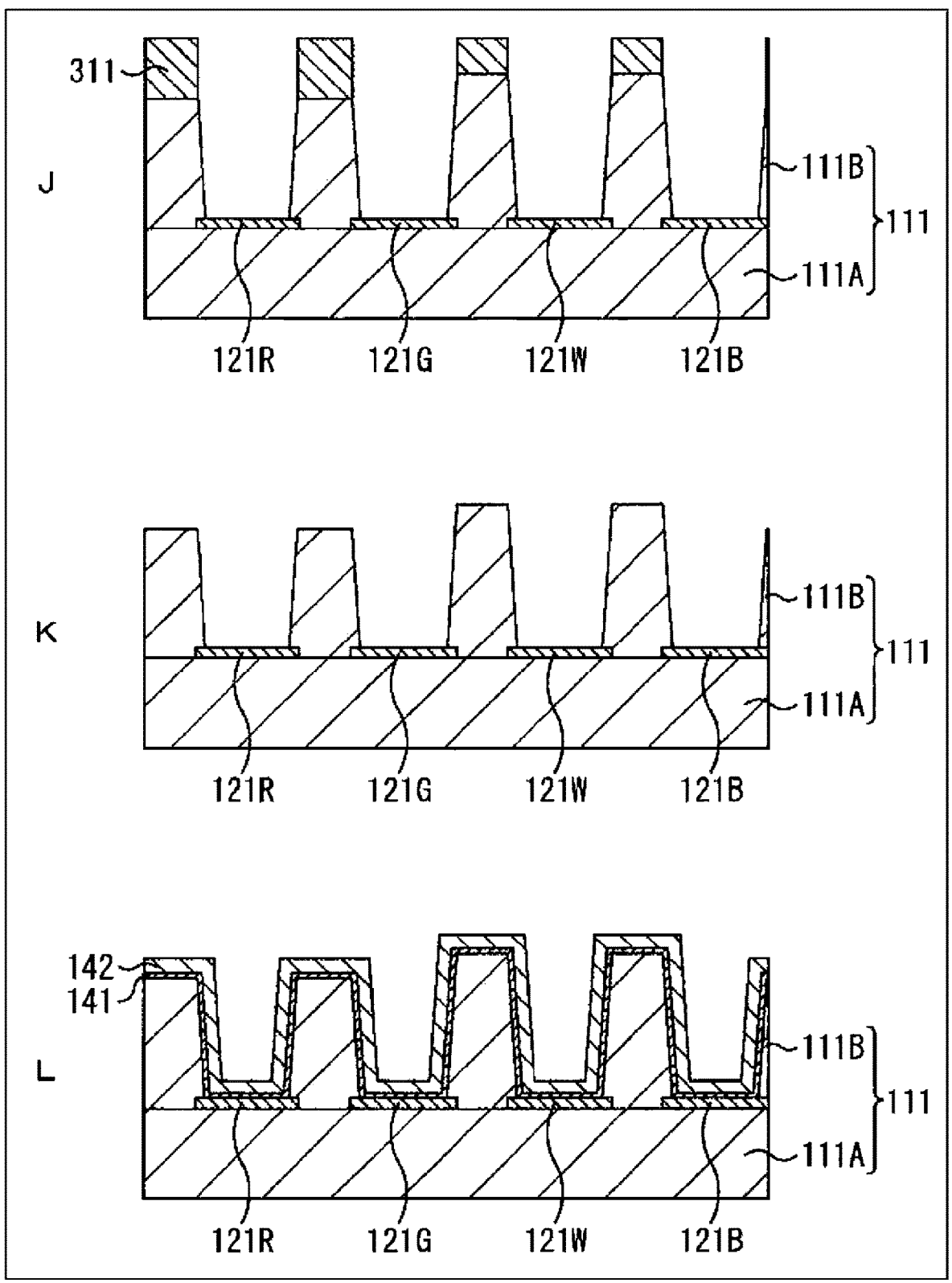
FIG. 26 is a diagram for describing a flow of a second example of a pixel manufacturing process according to an embodiment of the present technology.

Then, an etching process is performed as illustrated in J of FIG. 26. With the etching process, the portion excluding the portion masked by the photoresist 311 is etched, and a part of the first member 111B is processed. With the process, the reflectors having different heights in the respective sub pixels 100 are formed, and the anode electrodes 121R, 121G, 121W, and 121B on the first member 111A are exposed.

Then, a resist peeling process is performed as illustrated in K of FIG. 26. With the resist peeling process, the photoresist 311 is peeled off.

Then, a vapor deposition process and a CVD film forming process are performed as illustrated in L of FIG. 26. With the vapor deposition process, a layer 141 including an organic layer and a cathode electrode layer (formed of a transparent material such as ITO, for example) and a protective film 142 are formed on the surface of the anode electrodes 121R, 121G, 121W, and 121B and the first member 111B formed on the first member 111A. Further, the organic layer emits light between the anode electrode and the cathode electrode layer. For example, it is desirable that the organic layer emit white light. Further, for example, an insulating material, a conductive material, or the like can be used as a material of the protective film 142.

Figure 27:
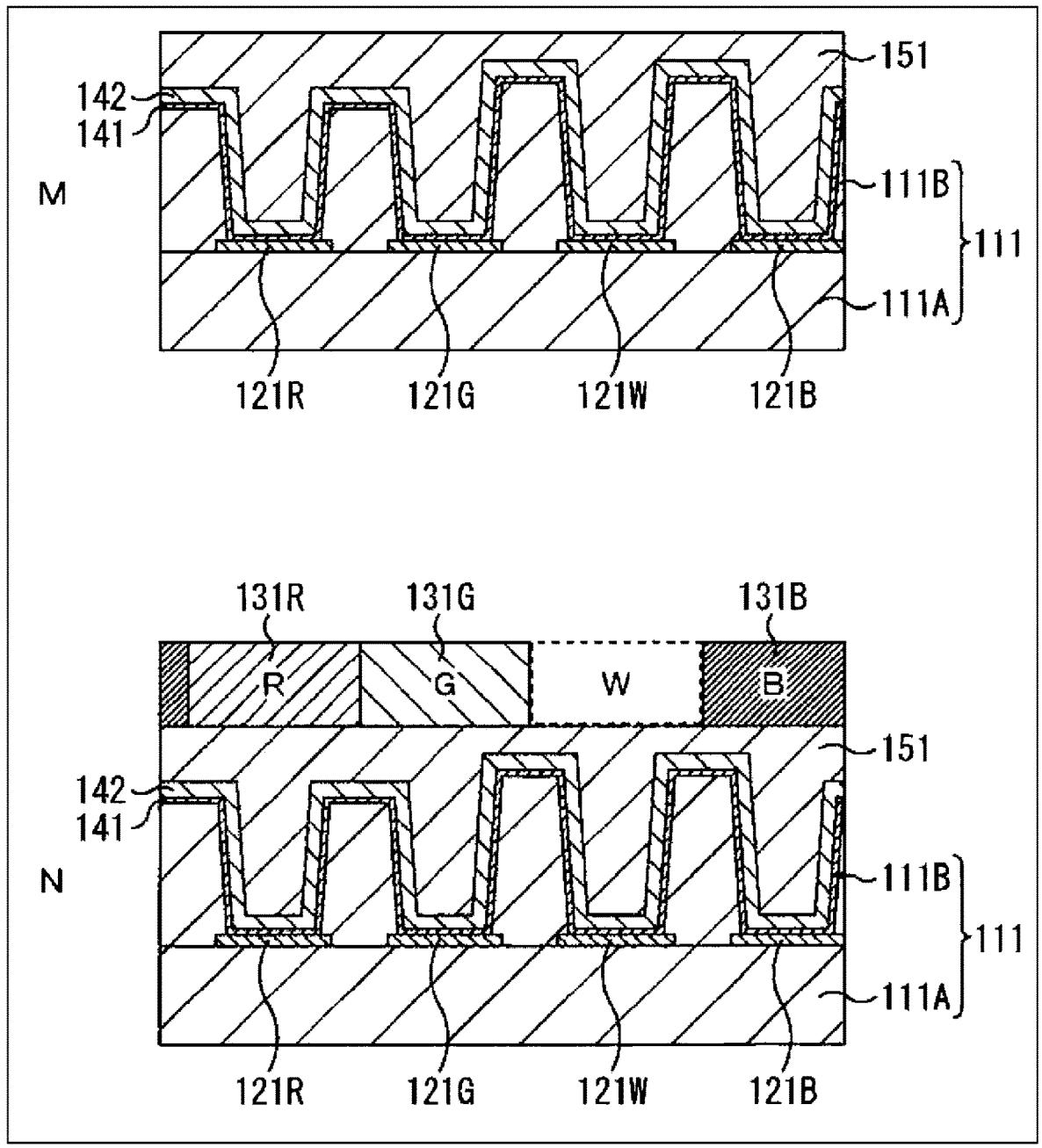
FIG. 27 is a diagram for describing a flow of a second example of a pixel manufacturing process according to an embodiment of the present technology.

Then, a planarizing process is performed as illustrated in M of FIG. 27. With the planarizing process, a second member 151 is embedded and planarized. Further, for example, a resin such as an acrylic resin, a polyimide resin, a silicon resin, or the like can be used as the second member.

As described above, after the layer 141 including the organic layer and the cathode electrode layer and the protective film 142 are formed, the second member 151 is further formed, so that the light reflecting layer (reflector structure) including the first member 111 (111B) and the second member 151 is formed.

Then, a color filter forming process is performed as illustrated in N of FIG. 27. With the color filter forming process, color filters 131R, 131G, and 131B are formed on the planarized second member 151.

In the pixel 10 manufactured as described above, since the inclined surface height of the reflector caused by the inclination of the inclined surface of the first member 111 is different for each sub pixel 100, the respective sub pixels 100 differ in luminance, and thus it is possible to improve the luminance of the specific sub pixel 100.

The second example of the manufacturing process has been described above.

2. Modified Example

In the above-described embodiments, the pixel 10 is described as being the WRGB pixel, that is, including the four sub pixels 100R, 100G, 100B, and 100W, but the configuration of the sub pixel 100 is not limited thereto.

For example, the pixel 10 may not include the sub pixel 100W and may include three sub pixels 100R, 100G, and 100B. Further, for example, a sub pixel 100 of another color having high visibility equal to that of white (W) may be used instead of the white (W) sub pixel 100W. Further, in the pixel 10, the arrangement order of a plurality of sub pixels 100 may be an arbitrary order that differs for each color.

Further, in the first and second embodiments, the inclined surface height of the reflector 112 is adjusted for each sub pixel 100, whereas in the third embodiment, the position of the anode electrode 121 side is adjusted for each sub pixel 100, but the adjustments may be performed at the same time. In other words, in the pixel 10, both the inclined surface height of the reflector 112 and the position on the anode electrode 121 side may be adjusted for each sub pixel 100.

Further, a material and a thickness of each layer, a film forming method, a film forming conditions, and the like described in the above embodiments are not limited to the above description, and other materials and thicknesses, or other film forming methods, and other film forming conditions may be used. Further, in the above-described embodiments and the like, the configuration of the organic light emitting element 101 has been specifically described, but it is not necessary to include all the layers, and another layer may be further included.

Further, in the above-described embodiments, the configuration of the active matrix type display element (display device) has been described, but the present technology can be also applied to a passive matrix type display element (display device). Furthermore, the configuration of the pixel drive circuit for active matrix driving is not limited to that described in the above embodiments, and a capacitive element, a transistor, or the like may be added if necessary. In this case, in addition to the signal line drive circuit 21 (FIG. 1) and the scan line drive circuit 22 (FIG. 1) described above, a necessary drive circuit may be appropriately added with a change in the pixel drive circuit.

3. Examples of Electronic Device (Example of Single-Lens Reflex Camera)

Figure 28:
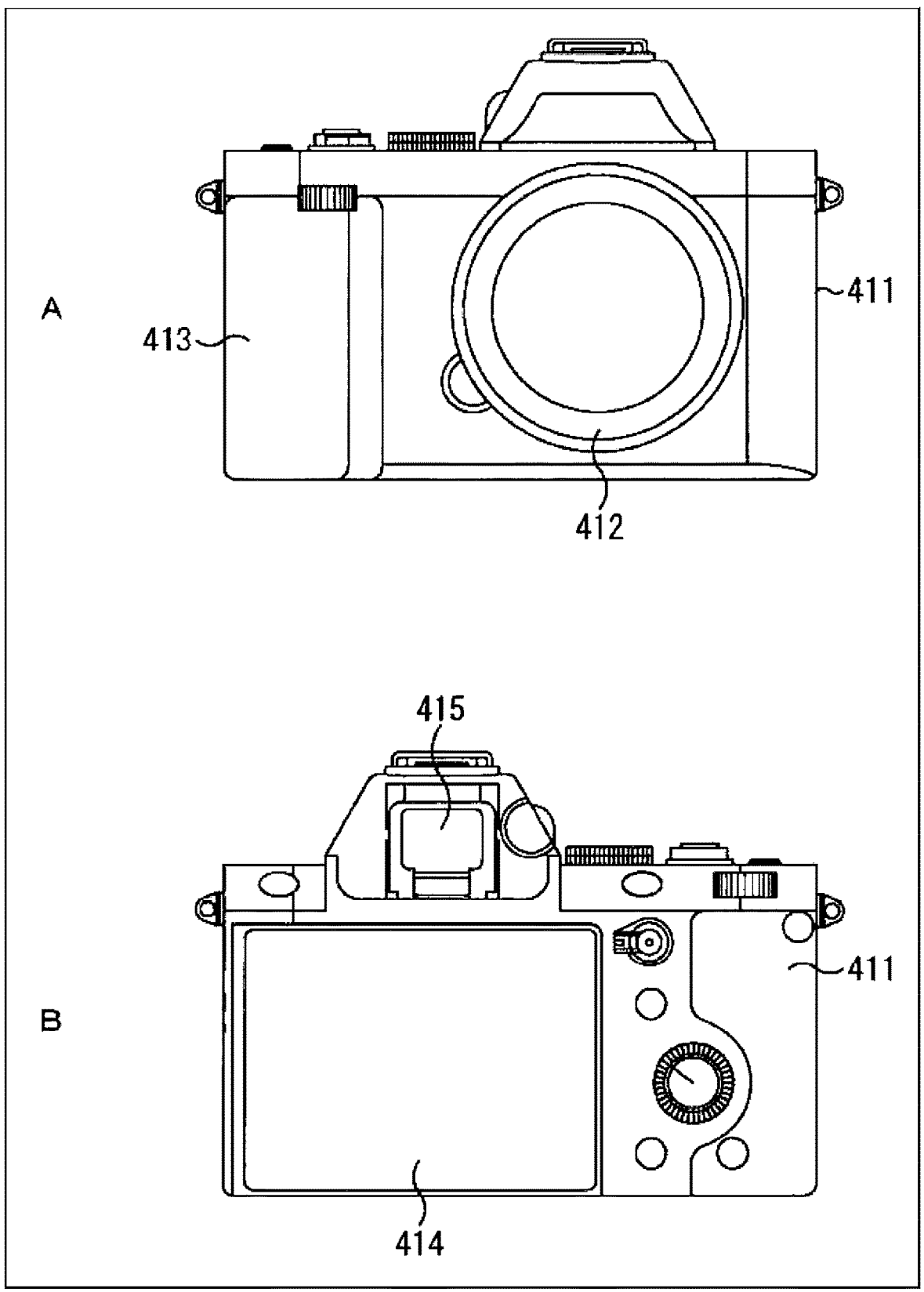
FIG. 28 is a diagram illustrating an example of an external appearance of a single-lens reflex camera as an electronic device to which a display element to which an embodiment of the present technology is applied is applied.

FIG. 28 illustrates an example of an external appearance of a single-lens reflex camera (a lens interchangeable single-lens reflex type digital camera) as an electronic device (an imaging apparatus) to which the display element to which an embodiment of the present technology is applied is applied.

As illustrated in A of FIG. 28, the single-lens reflex camera includes, for example, an interchangeable photographing lens unit (interchangeable lens) 412 installed on a front right side of a camera body (camera body) 411 and a grip portion 413 installed on a front left side and gripped by a photographer.

Further, as illustrated in B of FIG. 28, a monitor 414 is installed substantially at a central portion of a rear surface of the camera body 411. A viewfinder (eyepiece window) 415 is installed above the monitor 414. By looking into the viewfinder 415, the photographer can visually recognize a light image of a subject guided from the photographing lens unit 412 and decide a composition.

This viewfinder 415 is constituted by the display element (display element 1) to which an embodiment of the present technology described above is applied.

(Example of Head Mounted Display)

Figure 29:
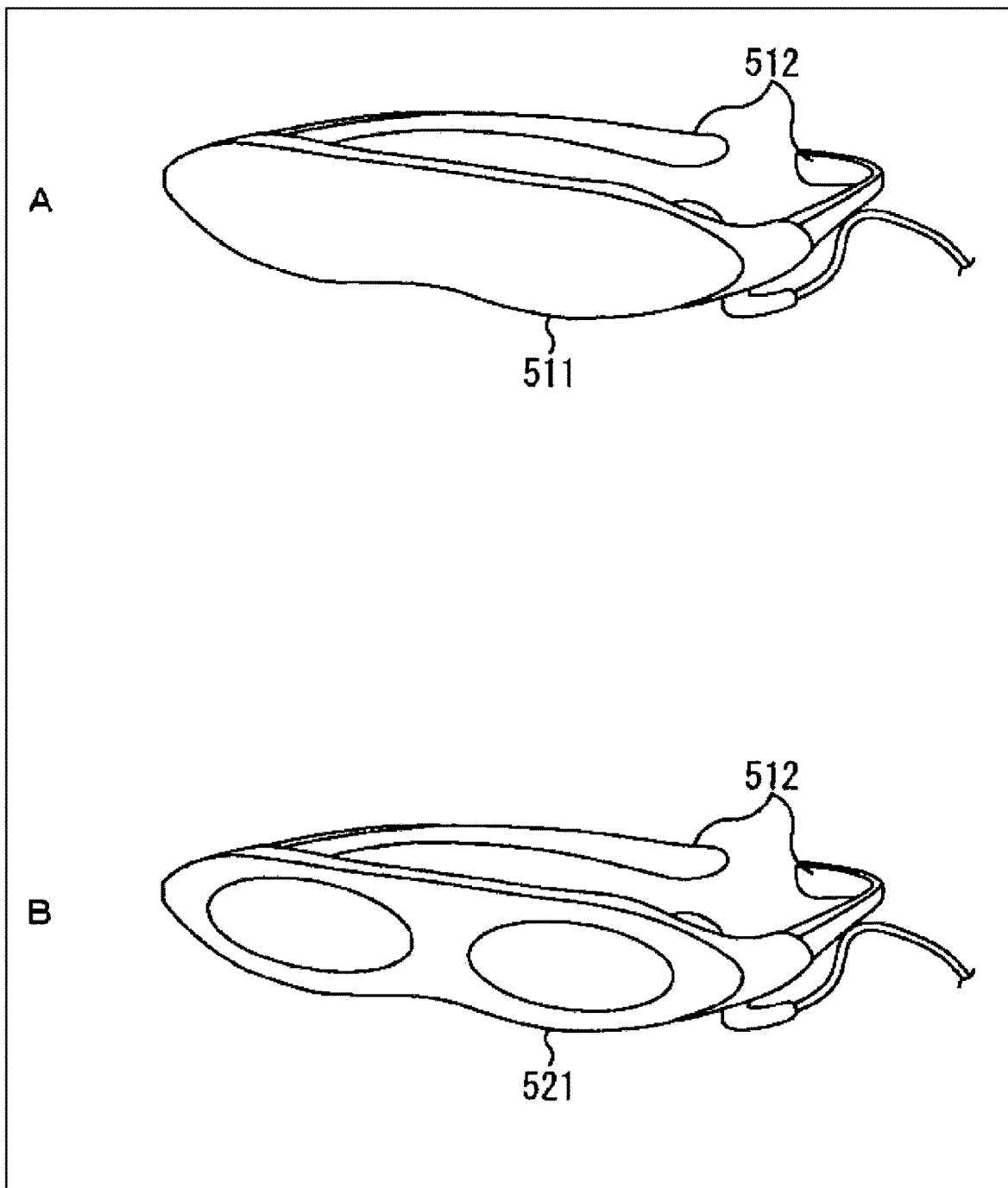
FIG. 29 is a diagram illustrating an example of an external appearance of a head mounted display as an electronic device to which a display element to which an embodiment of the present technology is applied is applied.

FIG. 29 illustrates an example of an external appearance of a head mounted display (HMD) as an electronic device to which the display element to which an embodiment of the present technology is applied is applied.

As illustrated in A of FIG. 29, the head mounted display includes, for example, ear hook portions 512 worn on a head of a user formed on both sides of a glasses type display unit 511. The display unit 511 is constituted by the display element (display element 1) to which an embodiment of the present technology is applied.

For example, the user wearing the head mounted display of A of FIG. 29 on the head can view a virtual reality (VR) video displayed on the display unit 511.

Further, A of FIG. 29 illustrates an example of a non-transmissive type head mounted display completely covering the eyes of the user, but a display unit 521 of a transmissive type (for example, video transmissive type or the like) head mounted display may be constituted by the display element (display element 1) to which an embodiment of the present technology is applied as illustrated in B of FIG. 29.

For example, the user wearing the head mounted display of B of FIG. 29 on the head can view an augmented reality (AR) image displayed on the display unit 521.

Other Examples

Further, in FIGS. 28 and 29, the single-lens reflex camera and the head mounted display are illustrated as the electronic devices to which the display element to which an embodiment of the present technology is applied is applied, but the display element to which an embodiment of the present technology is applied may be applied to an electronic device such as, for example, a smartphone, a television receiver, a personal computer, a video camera, a mobile phone, a game machine, a wearable device, or the like.

Further, the embodiments of the present technology are not limited to the above-described embodiments, and various modifications can be made within the scope not departing from the gist of the present technology.

According to an embodiment of the present technology, there is provided a display element, including: a display region including pixels arranged in a two-dimensional form, each of the pixels including a plurality of sub pixels. In each pixel, a height of a light reflecting portion with respect to a light emitting portion is adjusted for each sub pixel.

In a display element according to an embodiment of the present technology, a display region including pixels arranged in a two-dimensional form is provided, each of the pixels including a plurality of sub pixels. In each pixel, a height of a light reflecting portion with respect to a light emitting portion is adjusted for each sub pixel.

According to an embodiment of the present technology, there is provided an electronic device including a display element including a display region including pixels arranged in a two-dimensional form, each of the pixels including a plurality of sub pixels. In each pixel, a height of a light reflecting portion with respect to a light emitting portion is adjusted for each sub pixel.

An electronic device according to an embodiment of the present technology is equipped with a display element in which a display region including pixels arranged in a two-dimensional form is provided, each of the pixels including a plurality of sub pixels. In each pixel, a height of a light reflecting portion with respect to a light emitting portion is adjusted for each sub pixel.

Further, the display element or the electronic device according to embodiments of the present technology may be an independent device or an internal block constituting one device.

Additionally, the present technology may also be configured as below.

(1)

A display element, including:

a display region including pixels arranged in a two-dimensional form, each of the pixels including a plurality of sub pixels, in which, in each pixel, a height of a light reflecting portion with respect to a light emitting portion is adjusted for each sub pixel.

(2)

The display element according to (1), in which a height of an inclined surface of the light reflecting portion in a stacking direction is adjusted for each sub pixel.

(3)

The display element according to (2), in which the height of the inclined surface of the light reflecting portion is different for each sub pixel.

(4)

The display element according to (2), in which the height of the inclined surface of the light reflecting portion is different only in a specific sub pixel among the plurality of sub pixels.

(5)

The display element according to (1), in which a position of the light emitting portion in a stacking direction is adjusted for each sub pixel.

(6)

The display element according to (5), in which the position of the light emitting portion is different for each sub pixel.

(7)
The display element according to (5), in which the position of the light emitting portion is different only in a specific sub pixel among the plurality of sub pixels.

(8)
The display element according to any one of (1) to (7), in which a height of an inclined surface of the light reflecting portion is adjusted in accordance with an angle of the inclined surface of the light reflecting portion and a width of a light emitting part of the light emitting portion.

(9)
The display element according to any one of (1) to (8), in which each pixel includes a first sub pixel, a second sub pixel, and a third sub pixel that emit three basic colors of light and a fourth sub pixel that emits a non-basic color of light.

(10)
The display element according to (9), in which the basic colors of light include red light, green light, and blue light, and the non-basic color of light is white light.

(11)
The display element according to any one of (1) to (10), in which the sub pixel is a pixel including a light emitting element which emits light as the light emitting portion, and the light emitting element includes an electrode and an organic layer including a light emitting layer.

(12)
An electronic device including
a display element including
a display region including pixels arranged in a two-dimensional form, each of the pixels including a plurality of sub pixels,
in which, in each pixel, a height of a light reflecting portion with respect to a light emitting portion is adjusted for each sub pixel.

(13)
A display element, comprising:
a display region including a plurality of pixels arranged in a two-dimensional form, the plurality of pixels including a first pixel, a second pixel and a third pixel,
a first light reflecting portion located between the first pixel and the second pixel, and
a second light reflecting portion located between the second pixel and the third pixel,
wherein a height of the first light reflecting portion and a height of the second light reflecting portion with respect to a light emitting portion of the plurality of pixels are different.

(14)
The display element according to (13), wherein the height of the first light reflecting portion and the height of the second light reflecting portion are different with respect to a common plane in a stacking direction.

(15)
The display element according to (13), wherein a position of the first light reflecting portion and a position of the second light reflecting portion in a stacking direction relative to a position of a light emitting portion of the plurality of pixels are different.

(16)
The display element according to (13), wherein the height of each light reflecting portion is a length along which a light reflecting surface of that light reflecting portion extends in a stacking direction.

(17)
The display element according to (13), wherein each of the first, second and third pixels emits either one of the three basic colors of light or a non-basic color of light.

(18)
The display element according to (17), wherein the basic colors of light include red light, green light, and blue light, and the non-basic color of light is white light.

(19)
The display element according to (13),
wherein each pixel is a pixel including a light emitting element which emits light as the light emitting portion, and
the light emitting element includes an electrode and an organic layer including a light emitting layer.

(20)
An electronic device comprising
a display element, the display element comprising
a display region including a plurality of pixels arranged in a two-dimensional form, the plurality of pixels including a first pixel, a second pixel and a third pixel,
a first light reflecting portion located between the first pixel and the second pixel, and
a second light reflecting portion located between the second pixel and the third pixel,
wherein a height of the first light reflecting portion and a height of the second light reflection portion with respect to a light emitting portion of the plurality of pixels are different.

(21)
A bottom emission organic electroluminescence, EL, display element, comprising:
a display region including a plurality of pixels arranged in a two-dimensional form, the plurality of pixels including a first pixel, a second pixel and a third pixel,
a first light reflecting portion located between the first pixel and the second pixel, and
a second light reflecting portion located between the second pixel and the third pixel,
wherein a height of the first light reflecting portion and a height of the second light reflecting portion with respect to a light emitting portion of the plurality of pixels are the same.

(22)
The display element according to (21), wherein the height of each light reflecting portion is a length along which a light reflecting surface of that light reflecting portion extends in a stacking direction.

(23)
The display element according to (21), wherein each of the first, second and third pixels emits either one of the three basic colors of light or a non-basic color of light.

(24)
The display element according to (23), wherein the basic colors of light include red light, green light, and blue light, and the non-basic color of light is white light.

(25)
The display element according to (21), wherein
each pixel is a pixel including a light emitting element which emits light as a light emitting portion, and
the light emitting element includes an electrode and an organic layer including a light emitting layer.

(26)
An electronic device comprising a bottom emission organic EL display element, the bottom emission organic EL display element comprising:

a display region including a plurality of pixels arranged in a two-dimensional form, the plurality of pixels including a first pixel, a second pixel and a third pixel, a first light reflecting portion located between the first pixel and the second pixel, and a second light reflecting portion located between the second pixel and the third pixel, wherein a height of the first light reflecting portion and a height of the second light reflecting portion with respect to a light emitting portions of the plurality of pixels are the same.

REFERENCE SIGNS LIST 1 display element
10 pixel
11 substrate
21 signal line drive circuit
22 scan line drive circuit
23 display region
31 signal line
32 scan line
33 pixel drive circuit
100, 100R, 100G, 100B, 100W sub pixel
101, 101R, 101G, 101B, 101W organic light emitting element
111 first member
112, 112R, 112G, 112B, 112W reflector
121, 121R, 121G, 121B, 121W anode electrode
131, 131R, 131G, 131B color filter
141 layer
142 protective film
151 second member

The invention claimed is:

1. A display element, comprising:
a display region including a plurality of pixels arranged in a two-dimensional form, the plurality of pixels including a first pixel, a second pixel and a third pixel,
a first light reflecting portion located between the first pixel and the second pixel, and
a second light reflecting portion located between the second pixel and the third pixel,
wherein, in a cross-section perspective, a height of the first light reflecting portion and a height of the second light reflecting portion with respect to a light emitting portion of the plurality of pixels are different with respect to a plane extending in a horizontal direction.

2. The display element according to claim 1, wherein a first anode electrode corresponding to the first pixel, a second anode electrode corresponding to the second pixel, and a third anode electrode corresponding to the third pixel are arranged along the plane extending in the horizontal direction.

3. The display element according to claim 1, wherein each of the first, second and third pixels emits either one of the three basic colors of light or a non-basic color of light.

4. The display element according to claim 3, wherein the basic colors of light include red light, green light, and blue light, and the non-basic color of light is white light.

5. The display element according to claim 1,
wherein each pixel is a pixel including a light emitting element which emits light as the light emitting portion, and
the light emitting element includes an electrode and an organic layer including a light emitting layer, wherein the electrode is arranged along the plane extending in the horizontal direction.

6. An electronic device comprising
a display element, the display element comprising
a display region including a plurality of pixels arranged in a two-dimensional form, the plurality of pixels including a first pixel, a second pixel and a third pixel,
a first light reflecting portion located between the first pixel and the second pixel, and
a second light reflecting portion located between the second pixel and the third pixel,
wherein, in a cross-section perspective, a height of the first light reflecting portion and a height of the second light reflection portion with respect to a light emitting portion of the plurality of pixels are different with respect to a plane extending in a horizontal direction.

7. The electronic device according to claim 6, wherein a first anode electrode corresponding to the first pixel, a second anode electrode corresponding to the second pixel, and a third anode electrode corresponding to the third pixel are arranged along the plane extending in the horizontal direction.

8. The electronic device according to claim 6, wherein each of the first, second and third pixels emits either one of the three basic colors of light or a non-basic color of light.

9. The electronic device according to claim 8, wherein the basic colors of light include red light, green light, and blue light, and the non-basic color of light is white light.

10. The electronic device according to claim 6,
wherein each pixel is a pixel including a light emitting element which emits light as the light emitting portion, and
the light emitting element includes an electrode and an organic layer including a light emitting layer, wherein the electrode is arranged along the plane extending in the horizontal direction.

* * * * *